US007244464B2

(12) United States Patent
Robens et al.

(10) Patent No.: US 7,244,464 B2
(45) Date of Patent: Jul. 17, 2007

(54) SPRAY GUN WITH RANGE FINDER

(75) Inventors: Wayne Robens, Lakeville, MN (US); Timothy W. Ziegler, Independence, MN (US)

(73) Assignee: Wagner Spray Tech Corporation, Plymouth, MN (US)

( * ) Notice: Subject to any disclaimer, the term of this patent is extended or adjusted under 35 U.S.C. 154(b) by 0 days.

(21) Appl. No.: 10/809,048

(22) Filed: Mar. 25, 2004

(65) Prior Publication Data

US 2005/0214444 A1 Sep. 29, 2005

(51) Int. Cl.
*C23C 16/52* (2006.01)

(52) U.S. Cl. ..................... 427/8; 427/421.1; 427/427.3

(58) Field of Classification Search ............. 427/421.1, 427/427.3, 8
See application file for complete search history.

(56) References Cited

U.S. PATENT DOCUMENTS

| | | | | |
|---|---|---|---|---|
| 1,349,336 A | | 8/1920 | Haddock | |
| 2,376,836 A | | 5/1945 | Tunnicliffe | |
| 3,117,480 A | | 1/1964 | Peddinghaus | |
| 3,731,743 A | | 5/1973 | Marshall | |
| 3,878,811 A | | 4/1975 | Rombach | |
| 4,291,839 A | | 9/1981 | Brett | |
| 4,427,880 A | | 1/1984 | Kanade et al. | |
| 4,444,495 A | * | 4/1984 | Bramwell et al. | 356/138 |
| 4,556,815 A | | 12/1985 | Ohhashi et al. | |
| 4,702,931 A | | 10/1987 | Falcoff | |
| 4,836,671 A | | 6/1989 | Bautista | |
| 4,972,798 A | | 11/1990 | Ando et al. | |
| 4,982,897 A | | 1/1991 | Matusita et al. | |
| 5,152,841 A | | 10/1992 | Medler et al. | |
| 5,160,086 A | | 11/1992 | Kuykendal et al. | |
| 5,302,207 A | | 4/1994 | Jurcisin | |
| 5,327,218 A | | 7/1994 | Igaki | |
| 5,369,486 A | | 11/1994 | Matsumoto et al. | |

(Continued)

FOREIGN PATENT DOCUMENTS

AT 224238 T 10/2002

(Continued)

OTHER PUBLICATIONS

Laser Touch, Laser Guided Finish, from Brochure, 2 pgs.

(Continued)

*Primary Examiner*—Alain L. Bashore
(74) *Attorney, Agent, or Firm*—Faegre & Benson LLP

(57) ABSTRACT

A paint spray gun and range finder for positioning the gun with respect to a target surface to be sprayed. The range finder provides a user of the gun with information about the distance between the gun and the target surface, with different indications when the gun is too close, too far or distanced properly from the target surface to be sprayed. A visual or acoustic range finder provides visual or audible indications of the proximity of the gun to the target surface. One range finder has either a single laser diode and a beam splitter or a pair of laser diodes providing a pair of collimated optical beams which indicate distance to the target surface by the relative location of a pair of illuminated spots on the target surface. The spots may be offset when the gun is at the desired distance to the target surface.

9 Claims, 44 Drawing Sheets

U.S. PATENT DOCUMENTS

| | | | |
|---|---|---|---|
| 5,598,972 | A | 2/1997 | Klein, II et al. |
| 5,757,498 | A | 5/1998 | Klein, II et al. |
| 5,857,625 | A | 1/1999 | Klein et al. |
| 5,868,840 | A | 2/1999 | Klein, II et al. |
| 5,951,296 | A | 9/1999 | Klein |
| 6,301,997 | B1 * | 10/2001 | Welte ............................ 81/54 |
| 6,557,815 | B1 | 5/2003 | Klein, II |

FOREIGN PATENT DOCUMENTS

| | | |
|---|---|---|
| AT | 258466 T | 2/2004 |
| DE | 3148293 | 7/1983 |
| DE | 69623780 | 5/2003 |
| DE | 69821357 | 3/2004 |
| JP | 05154422 | 6/1993 |
| JP | 06163499 | 6/1994 |
| NZ | 313454 | 4/1999 |
| WO | WO 97/03759 | 2/1997 |

OTHER PUBLICATIONS

Laser Guiding Device Points to Material Saving www.iwrc.org/programs/ltarticle.cfm, 2 pgs.

ETV Joint Verification Statement, The Environmental Technology Verification Program, 6 pages.

* cited by examiner

SPRAY GUN WITH RANGE FINDER

BACKGROUND OF THE INVENTION

This invention relates to the field of spray guns, particularly, hand held spray guns suitable for spraying paint and similar coatings. Prior art spray guns relied upon user judgment to position the gun with respect to a target surface to be painted. Typically, user manuals advised the user to hold the gun such that a central axis of the spray pattern remains perpendicular to and at a constant distance from the target surface to be sprayed. The vast majority of target surfaces to be sprayed are at least generally planar. Varying the distance between the spray gun and the target surface ordinarily results in uneven coverage and may result in some regions having less than full coverage, while other regions receive excess sprayed material, which may result in sags and or runs.

The present invention provides an aid to a user in maintaining the proper distance between the spray gun and the target surface by providing a range finder with the spray gun to provide the user with information regarding the distance between the gun and the target surface.

DETAILED DESCRIPTION OF THE INVENTION

Figure 1:
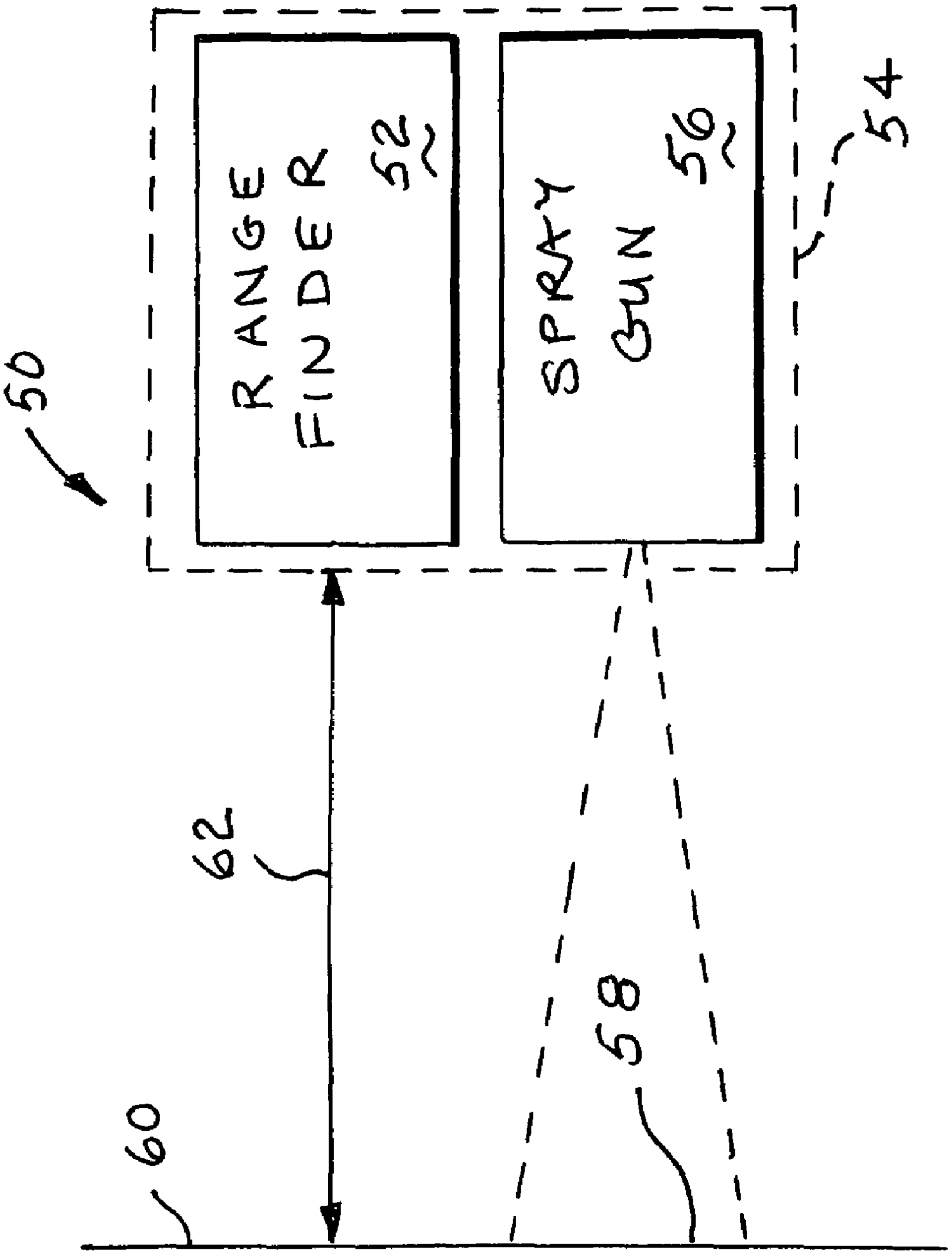
FIG. 1 is a simplified block diagram of a combination of a range finder and spray gun according to the present invention.

Referring now to the Figures, and most particularly to FIG. 1, a simplified block diagram 50 of the present invention may be seen. A range finder 52 may be combined in an assembly 54 with a spray gun 56, where the spray gun is of the type for spraying paint and similar coatings. When selectively triggered, the spray gun 56 provides a spray pattern 58 to apply the coating to a target surface 60, indicated schematically by a line in FIG. 1. It is to be understood that the target surface 60 is often a generally planar surface, but it is to be understood that the term "target surface" as used herein may apply to any geometrically shaped surface to be coated, with the planar surface merely used by way of example.

It is to be further understood that the range finder 52 provides a user of the gun 56 with information about the distance 62 between the gun assembly 54 and the target surface 60. The information about distance 62 is preferably provided in terms of how far the spray gun 56 is from the target surface, such that the range finder may be calibrated to enable or assist a user to position the gun 56 at a desired distance, typically about 12 inches from the target surface 60. More particularly, in connection with one model of spray gun, the desired distance may be 12 inches as measured from the atomizing tip exit surface 64 (see FIGS. 2, 3 and 4) to the target surface 60. It is further to be understood that distances other than 12 inches may be chosen to be the "desired distance," as that term is used herein. For example, some coatings may be advantageously applied at a desired distance other than 12 inches, or an alternative tip or gun may be designed to be used at some other "desired distance" from the target surface.

Figure 2:
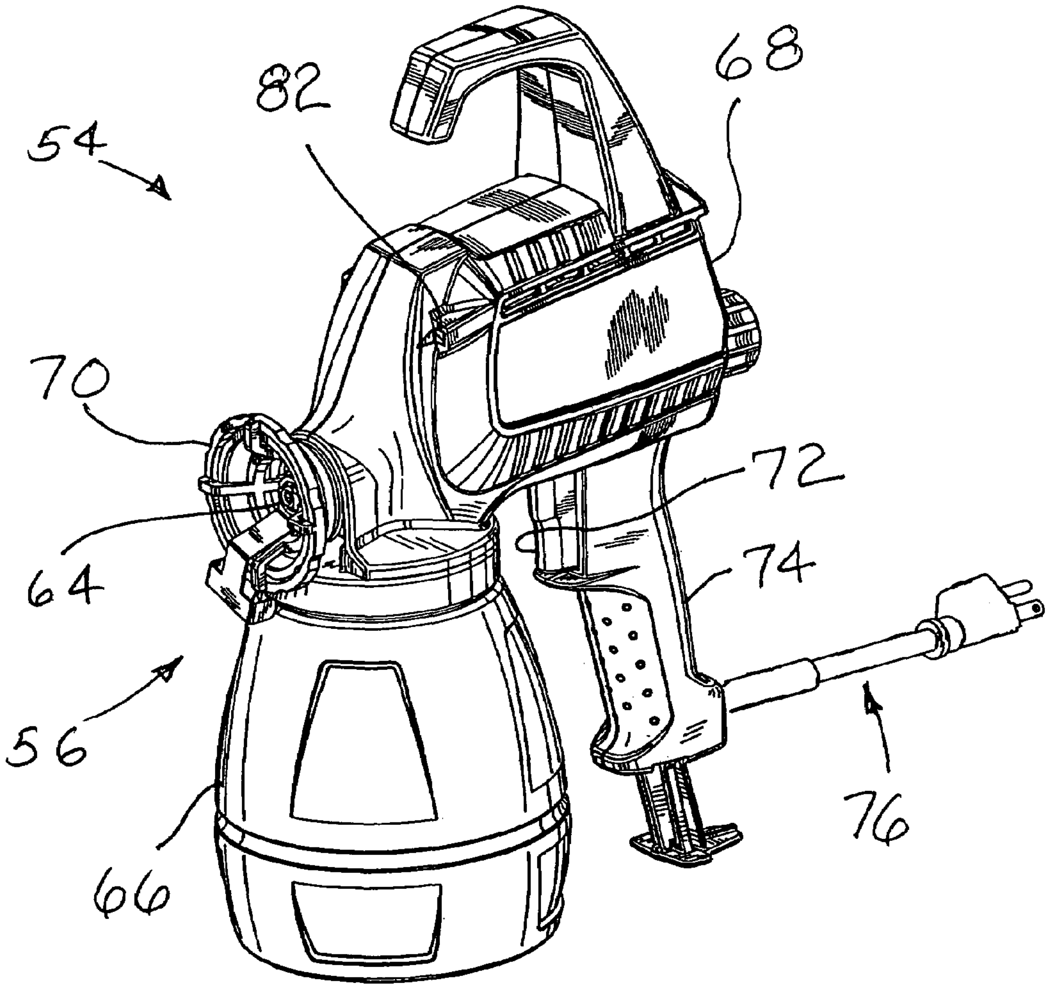
FIG. 2 is a perspective view of the combined range finder and spray gun of the present invention.
Figure 3:
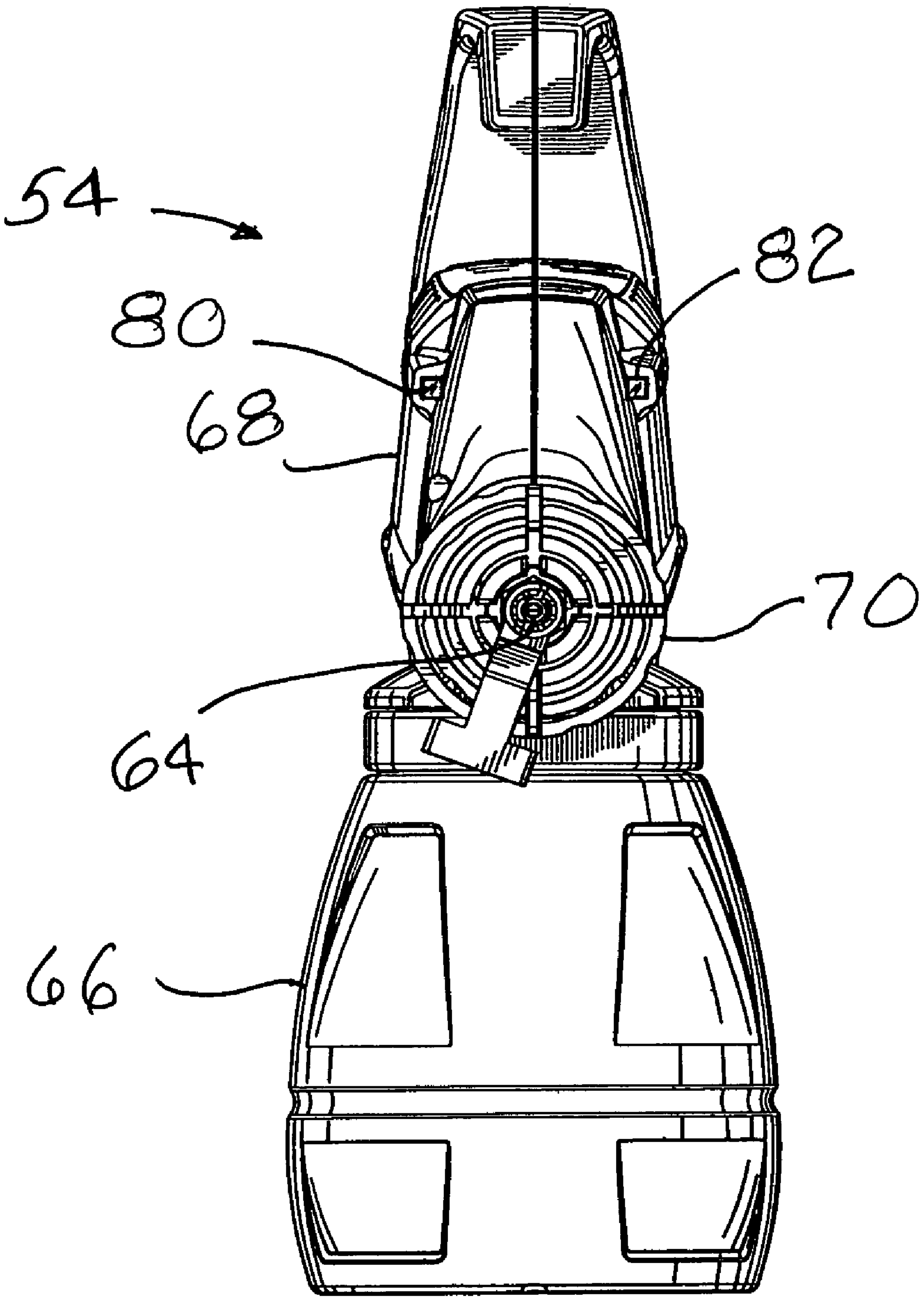
FIG. 3 is a front view of the combined range finder and spray gun shown in FIG. 2.
Figure 4:
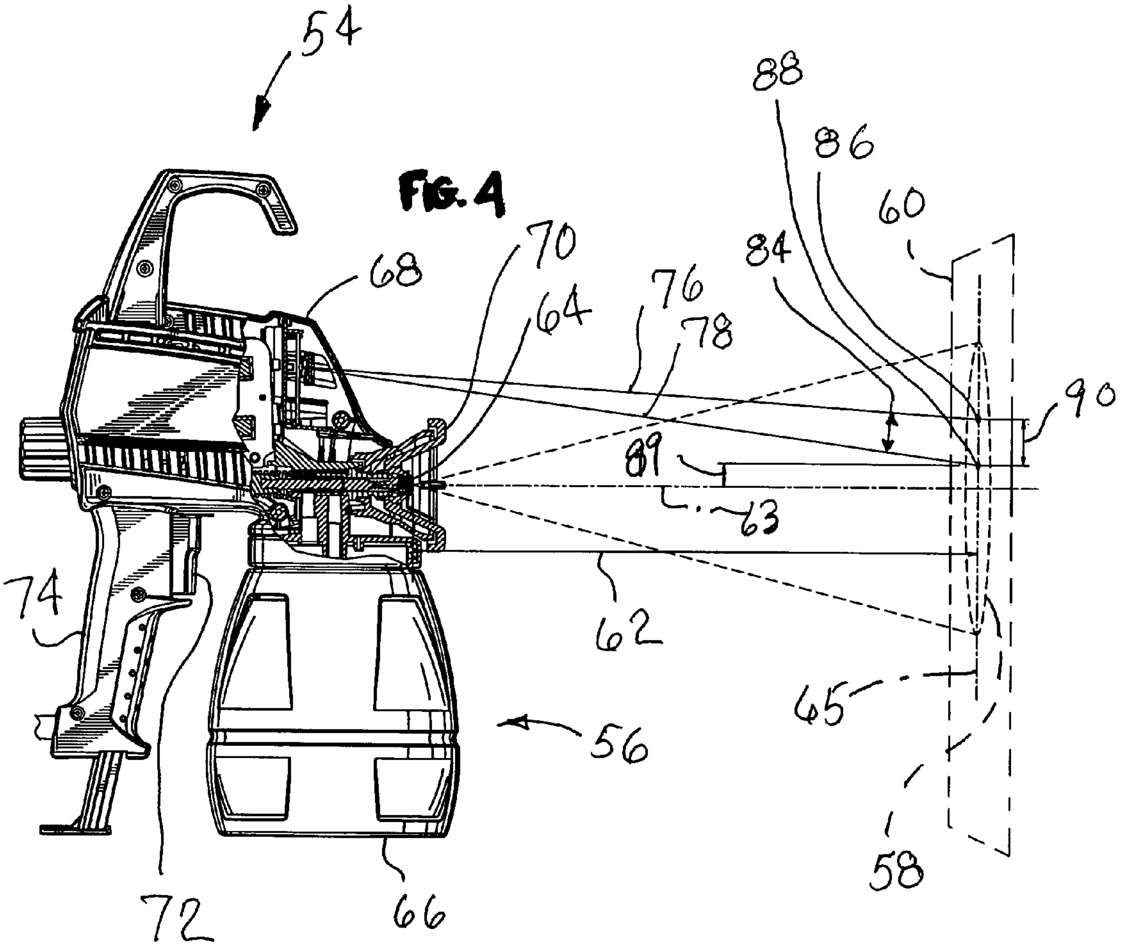
FIG. 4 is a side view of the combined range finder and spray gun of FIG. 2 with a simplified schematic representation of a spray pattern of the gun and a pair of beams from the range finder directed at a generally planar target surface.

Referring now most particularly to FIGS. 2, 3 and 4, the spray gun 56 included in assembly 54 may include a material reservoir 66 attached to a housing 68. A spray tip 70 delivers atomized coating material from the reservoir 66 in a spray pattern 58 when the gun 56 is activated by pulling on a trigger 72. Spray gun 56 is directed by a user grasping a handle 74 to position and control the gun 56. The gun 56 and range finder 52 are preferably electrically powered via a cord set 76. In order to effectively apply the coating material, it is preferably that the spray gun 56 be held at a desired distance from the target surface 60 and moved parallel to the target surface 60 as the coating material is applied. It is also preferable that the spray gun 56 be held generally perpendicular to the target surface 60, more particularly, that a central axis 63 of the spray pattern 58 be held generally perpendicular to the target surface 60.

In the practice of the present invention, spray gun assembly 54 may include the range finder 52 inside housing 68. In operation, the range finder 52 is energized by partially activating trigger 72 to provide information to enable the user to position the gun at a desired distance from the target surface initially without energizing spray gun 56 to provide atomized coating material. The spray gun assembly 54 is initially positioned at the desired distance from the target surface by utilizing the information from the range finder and moving the gun toward or away from the surface until the gun is located at the desired distance from the target surface. The trigger 72 may then be fully activated or depressed, causing the gun 56 to emit atomized coating material at which time the gun is preferably moved parallel to the target surface while maintaining the desired distance between the gun and the target surface using the information provided by the range finder 52.

Figure 7:
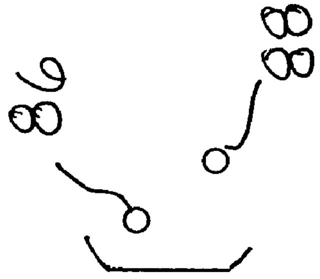
FIG. 7 is a view of the illuminated spots misaligned in a second relationship indicating that the spray gun is at a position greater than the desired distance from the target surface.
Figure 6:
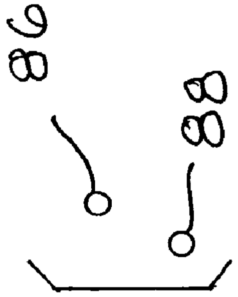
FIG. 6 is a view of the illuminated spots misaligned in a first relationship indicating that the spray gun is at a position less than the desired distance from the target surface.
Figure 5:
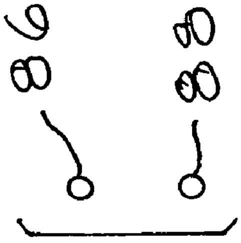
FIG. 5 is a view of the illuminated spots aligned and indicating that the spray gun is located at a desired distance from the target surface.

In a first embodiment, range finder 52 provides information in the form of a visually perceptible set of images on the target surface by emitting a pair of beams 76, 78 via a pair of apertures 80, 82 in housing 68. The beams 76 and 78 each project an illuminated image or spot on the target surface. Beams 76 and 78 are angled toward each other such that they are aligned with each other (preferably, but not necessarily along a vertically-oriented axis 65 when the gun 56 is at the desired distance from the target surface. Axis 65 is to be understood to be on surface 60 when surface 60 is generally planar. Axis 65 may be tangent to surface 60 where axis 63 intersects surface 60, when surface 60 is not generally planar). It has been found preferable to have beams 76 and 78 offset such that the illuminated spots are always offset from each other. Preferably, when the gun is at the desired distance, the spots are aligned with each other (as shown in FIG. 5) and when the gun is not at the desired distance from the target surface, the images are misaligned with each other (as shown in FIGS. 6 and 7). It has been found desirable (but not essential to the practice of the present invention) to offset the beams and images to enable the user to distinguish the condition where the gun is less than the desired distance from the condition where the gun is greater than the desired distance from the target surface, to enable easy correction by the user. If the images are not offset, the user will have to experimentally move the gun towards or away from the target surface to determine the correct direction to move the gun to arrive at the desired spacing or distance between the spray gun 56 and the target surface 60. FIG. 6 illustrates the image misalignment corresponding to a position of the gun closer to the target surface than the desired distance, and FIG. 7 illustrates the image misalignment corresponding to a position of the gun farther away from target surface than the desired distance.

Figure 8:
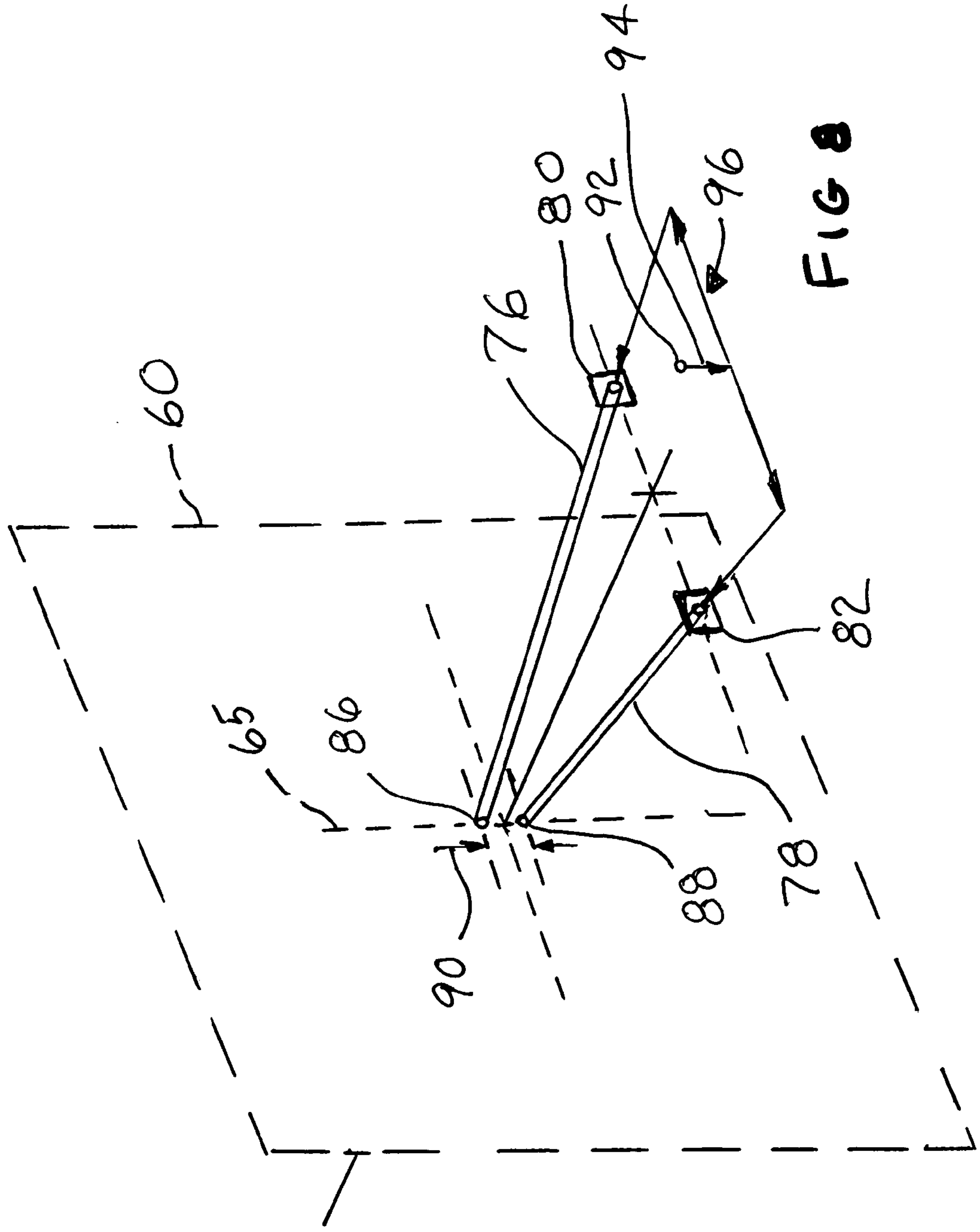
FIG. 8 is a schematic three dimensional view of the beams exiting the light pipe and illuminating a pair of spots on a generally planar target surface with the spray gun at a desired distance from the target surface.

Referring now to FIGS. 5 and 8, when the spray gun is located at the desired distance from the target surface, light beams 76 and 78 will create the image of FIG. 5 on the target surface, with a pair of illuminated spots or images 86 and 88, corresponding, respectively to the light beams 76 and 78. In FIGS. 5 and 8, the spots 86, 88 are vertically aligned to indicate that the gun 56 is at the desired distance (when the gun is pointing generally perpendicularly to the target surface 60). Beams 76 and 78 are offset sufficiently to offset spots 86 and 88 by an offset distance 90 in this situation. Referring now again to FIG. 4, offset distance 90 is preferably 1 inch, and spot 88 may be located at a predetermined spacing 91 from the intersection of central axis 63 and surface 60. The predetermined spacing 91 is preferably 0.5 inches. In FIG. 4, it may be seen that the beams 76 and 78 are located apart by a predetermined diverging angle 84 to achieve the results described with respect to the spots as shown in FIGS. 5, 6 and 7. In one embodiment, a visible light source 92 emits visible light indicated by arrow 94. In an alternative embodiment (described infra), two visible light sources are used. If one light source is used, the light travelling in the direction of arrow 94 is split in a bifurcated light path 96 and emitted through apertures 80 and 82 in the gun housing 68, as mentioned above. Light path or optical path 96 is within a light pipe described infra.

Figure 4A:
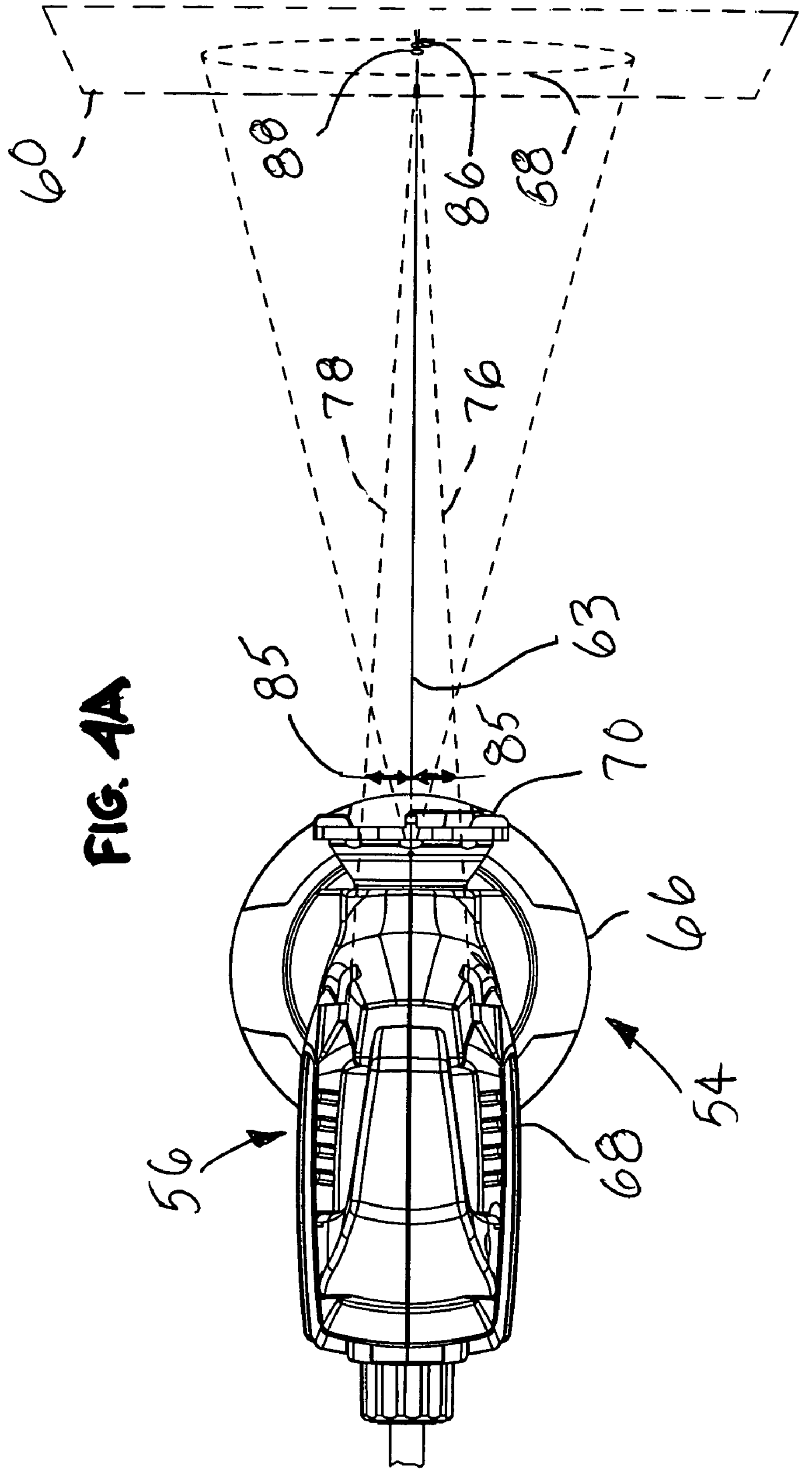
FIG. 4A is a top view corresponding to FIG. 4.

Referring now to FIG. 4A, it may be seen that beams 76 and 78 are each arranged at a predetermined converging angle 85 with respect to the central axis 63 such that the spots 86 and 88 are vertically aligned on surface 60 when the gun 56 is at the desired distance from the target surface 60. In one embodiment, angle 85 may be 3.6 degrees.

Figure 9:
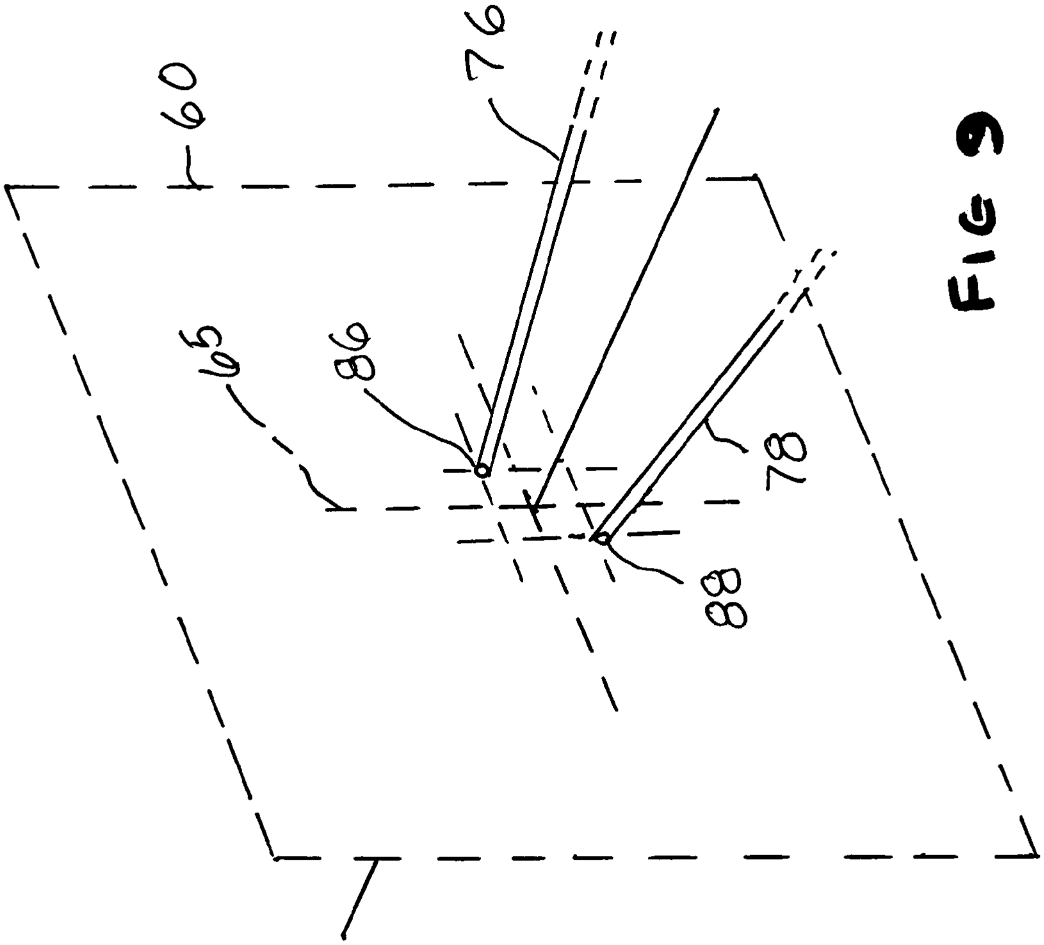
FIG. 9 is a view similar to that of FIG. 8, except with the gun positioned closer to the target surface than in FIG. 8.

Referring now to FIGS. 6 and 9, when the spray gun 56 is closer than the desired distance to the target surface 60, the light beams 76 and 78 will create the image formed by spots 86 and 88 in FIG. 6. In this situation, spot 86 is displaced horizontally to the right of spot 88. It is to be understood that the closer the gun 56 is positioned to the target surface 60 the greater will be the displacement of spots 86 and 88. Accordingly, it will be readily apparent to the user to move the gun away from the target surface, causing the spots to progress to their closest approach to each other, indicated by the condition shown in FIGS. 5 and 8, thus guiding the user to locate the gun at the desired distance from the target surface.

Figure 10:
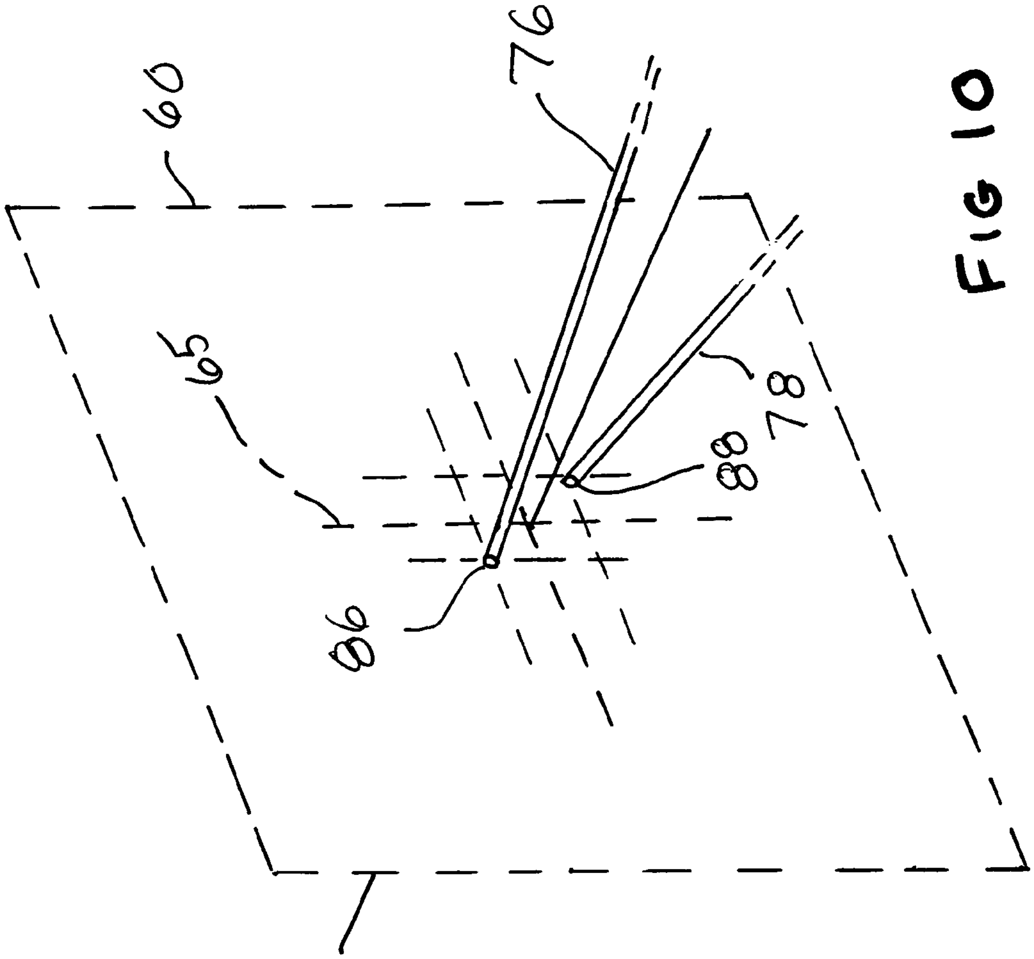
FIG. 10 is a view similar to that of FIG. 8, except with the gun positioned farther away from the target surface than in FIG. 8.

Referring now to FIGS. 7 and 10, when the spray gun 56 is at a position greater than the desired distance from the target surface 60, the light beams 76 and 78 will create the image formed by spots 86 and 88 in FIG. 7. In this situation, spot 86 is displaced horizontally to the left of spot 88. It is to be understood that when the distance between the gun and target surface is initially greater than the desired distance, and the gun 56 is moved toward the target surface 60, the closer spots 86 and 88 will approach each other, until the image of FIG. 5 is obtained. If the gun is moved still closer to the target surface, the image of FIG. 6 will appear. Accordingly, it will be readily apparent to the user to move the gun towards the target surface when starting with the image of FIG. 7, causing the spots to approach each other until the condition shown in FIGS. 5 and 8 is met, locating the gun at the desired distance from the target surface. Similarly, it will be apparent to the user to reverse the process when the gun is initially too close to the target surface (because of the optically visible feedback of the moving spots 86 and 88 when the distance between the gun and target surface is changed in this embodiment).

Figure 11:
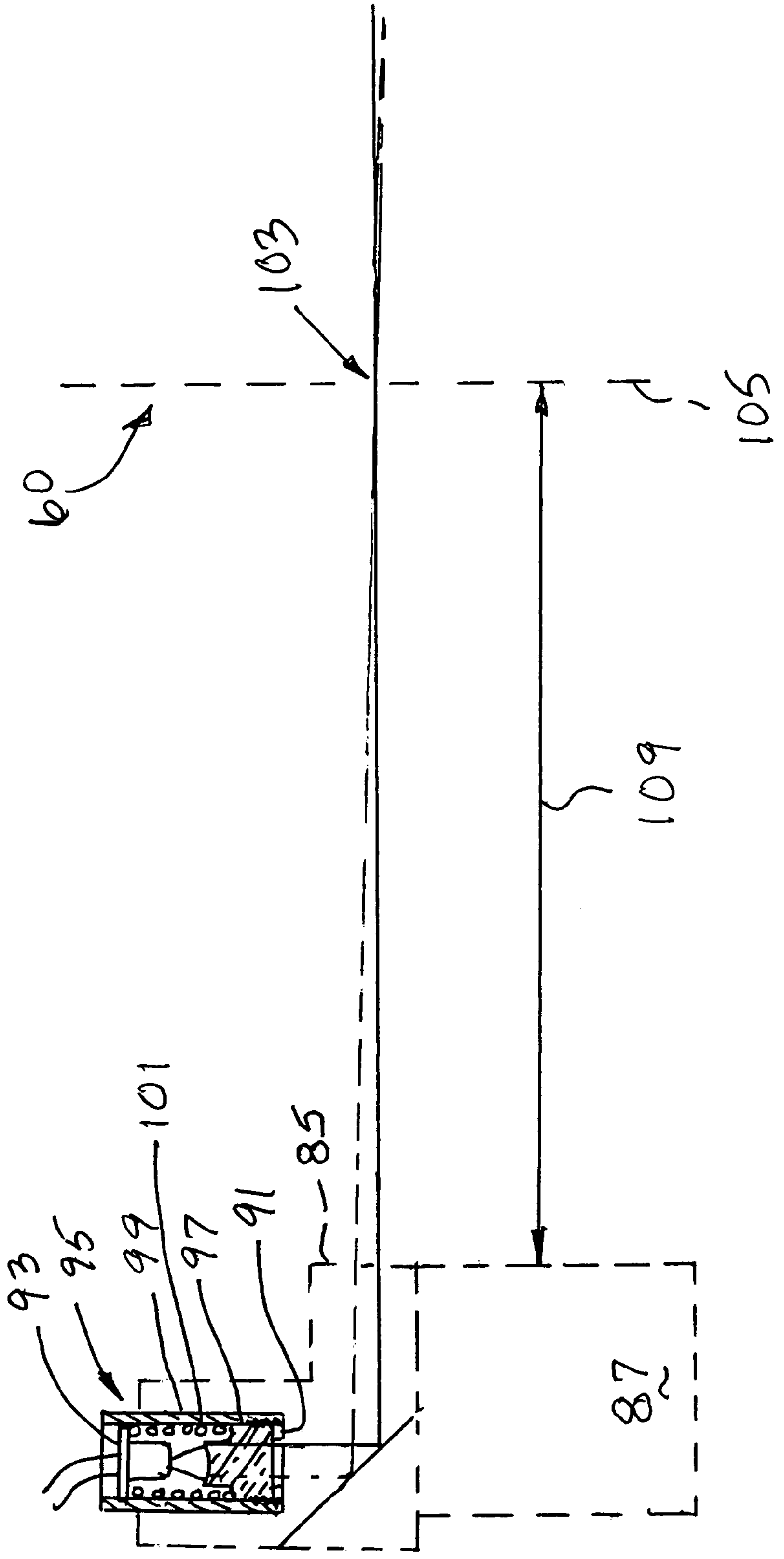
FIG. 11 is a simplified schematic view of a fixture for a laser diode of the present invention illustrating the aspect of the present invention wherein a beam waist is adjusted to be at a plane of the target surface when the spray gun is at the desired distance from the target surface.

Referring now to FIG. 11, a simplified fixture 84 useful in the practice of the present invention may be seen. Fixture 84 includes a holder 85 for a light source 92 with the holder 85 mounted to a stage or base 87 positionable with respect to a reference plane 105 corresponding to the target surface 60. The light source 92 preferably includes a laser diode 93 in an assembly 95 having a collimating lens 97, the assembly 95 available as part number EL-201 from E-Laser Enterprise Co. Ltd. at 406 Taichung, Taiwan, ROC. The laser diode 98 provides a generally fan-shaped beam of visible light diverging about 8 degrees in a first transverse direction and diverging at about 40 degrees in a second transverse direction. The collimating lens 97 may be used to change the beam from a diverging to a converging characteristic. A cylindrical housing 99 carries the diode and collimating lens 97 held spaced apart by a compression spring 101. A retaining ring 91 is threaded into an end of the housing 99 to retain the spring 101 and lens 97. In one aspect of the present invention, it has been found desirable to "tune" or "over-collimate" the light exiting the assembly 95 such that a "beam waist" 103 i.e., the narrowest part of the beam, will occur at the reference plane 105 corresponding to the target surface 60 when the assembly 95 is combined with the spray gun 56 and the spray gun is at the desired distance 109 from the plane 105 of the target surface 60. Over-collimating the visible light from the light source in this way will intensify the illuminated spots when the spray gun is positioned at the desired distance from the target surface.

Figure 12:
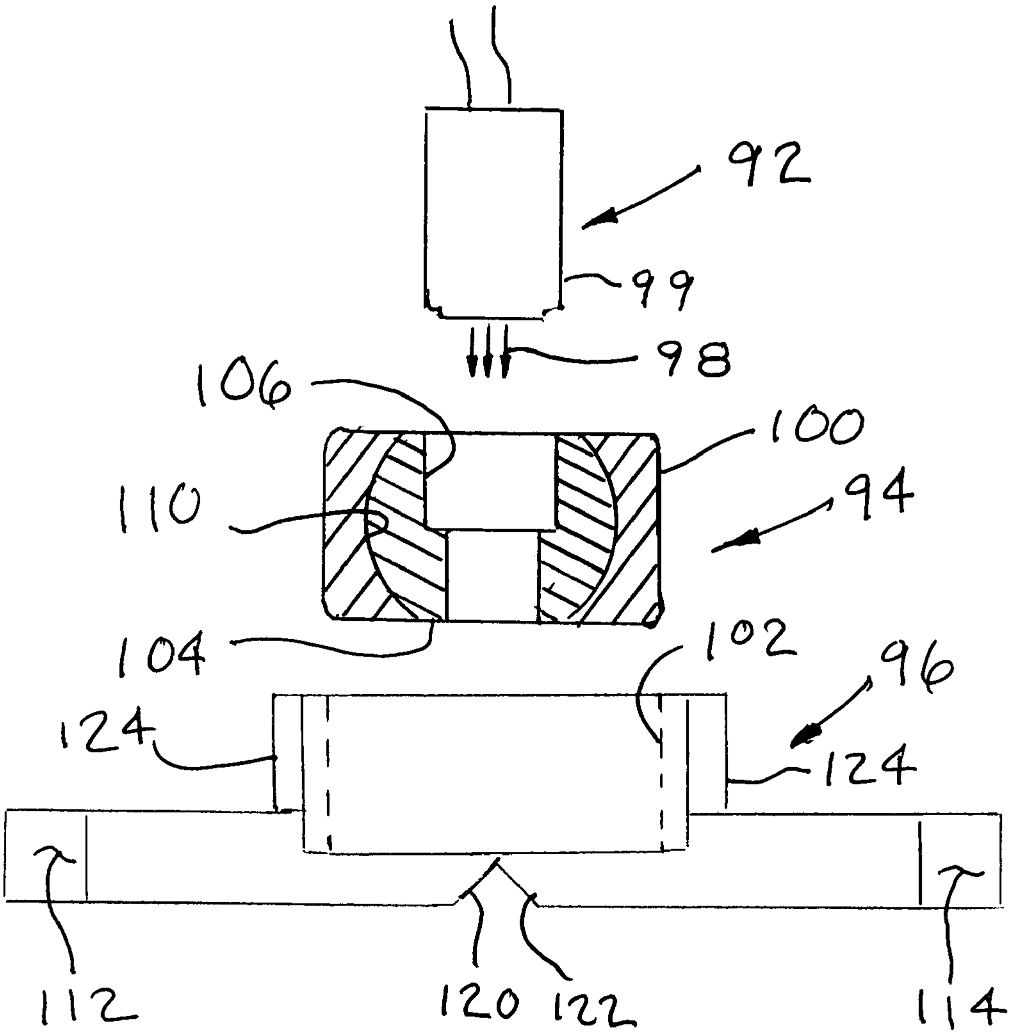
FIG. 12 is an exploded elevation view with some parts in section showing a light source, alignment gimbal, and light pipe useful in the practice of one embodiment of the present invention.

Referring now to FIG. 12, the light source 92 is shown in an exploded view along with an alignment gimbal 94, and a light pipe 96 useful in the practice of the present invention. The over-collimated visible light output 98 emitted by the light source 92 will be split into the two beams 76 and 78 by a first pair of reflecting surfaces 120, 122 in the light pipe 96. Light pipe 96 is may be made of a total internal reflection material, such as a suitable clear or transparent polymer. The alignment gimbal 94 has an outer sleeve 100 closely interfitting a bore 102 in the light pipe 96. Both sleeve 100 and bore 102 may be generally D-shaped in cross section. An inner element 104 has a bore 106 closely interfitting an outside diameter of the cylindrical housing 99 of the light source 92. Inner element 104 and outer sleeve 100 have a mating spherical interface surface 110. Element 104 and sleeve 100 may be formed of a conventional polymer material.

Figure 13:
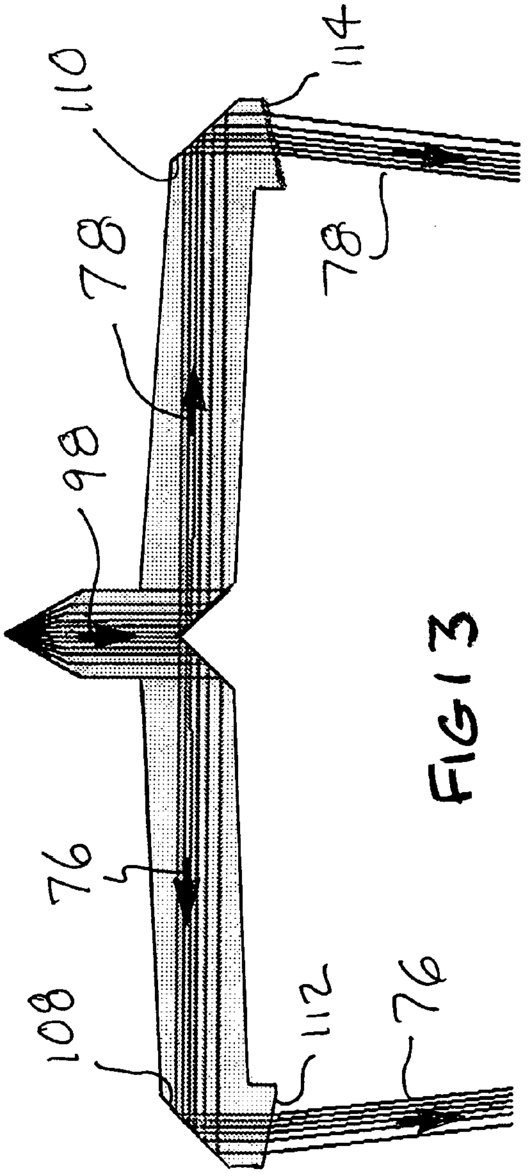
FIG. 13 is a simplified schematic top plan representation of the optical path of the light pipe of FIG. 12, except with the initial part of the path illustrated schematically folded to a position to be in-plane with the remainder of the path through the light pipe.
Figure 14:
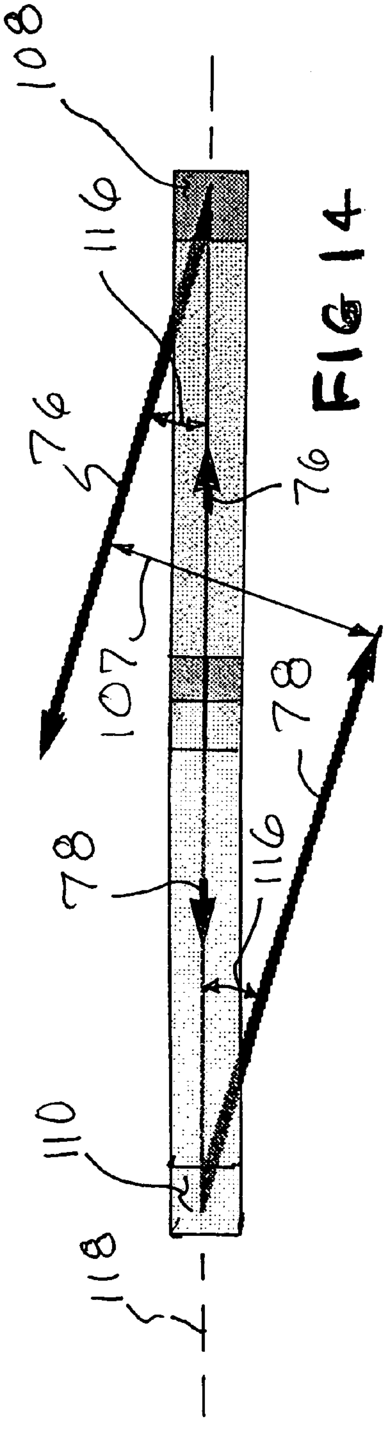
FIG. 14 is a simplified schematic rear elevation view of the arrangement of FIG. 6 illustrating the orientation of the beams exiting the light pipe.
Figure 15:
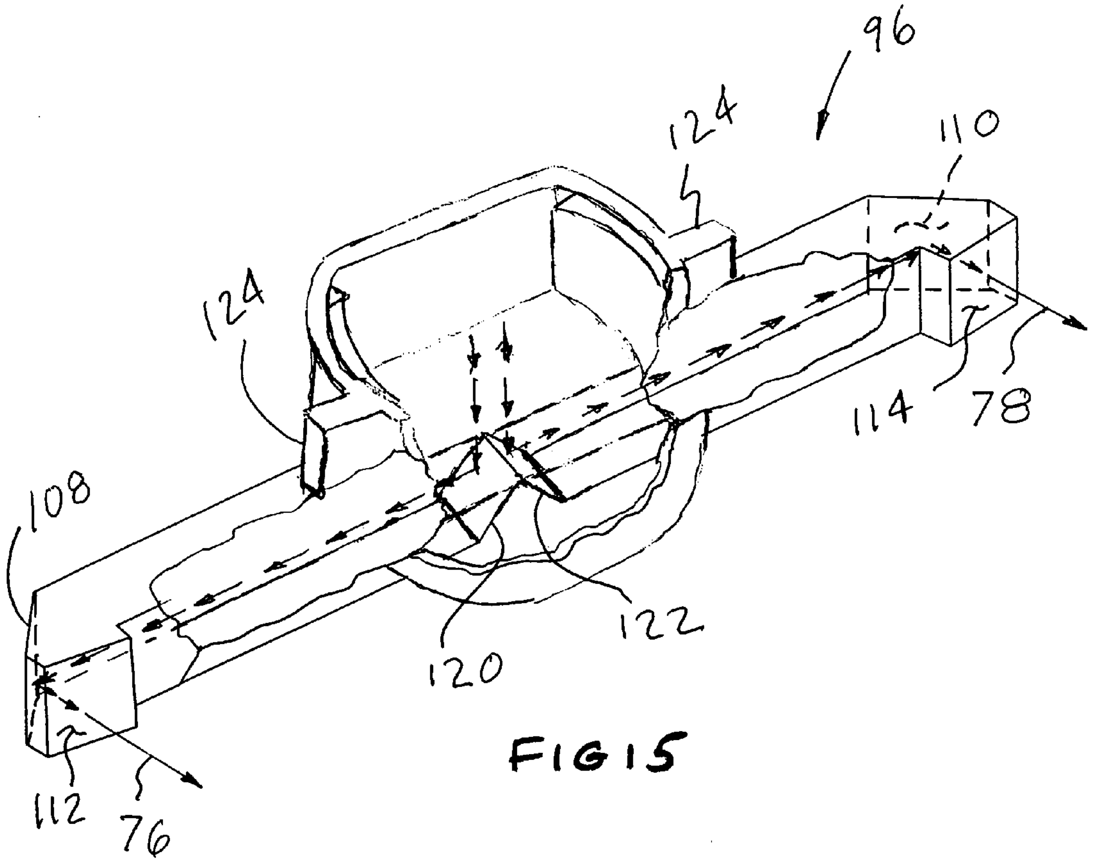
FIG. 15 is a simplified schematic perspective view from above and in front of the light pipe partially cut away to more clearly show the optical path within the light pipe.

Once the light source 92 is "over-collimated" as described above and the assembly 95 is received in element 104, the alignment gimbal 94 may be adjusted to align the light source 92 with the light pipe 96, more particularly, to balance and orient beams 76 and 78 in the light pipe as shown in FIGS. 13 and 14 to achieve the desired images of FIGS. 5–7. After alignment, the inner element 104 and outer sleeve 100 are preferably permanently secured together such as by application of an adhesive at an edge of the interface 110 to permanently lock or secure the alignment of the light source 92 and light pipe 96.

Figure 16:
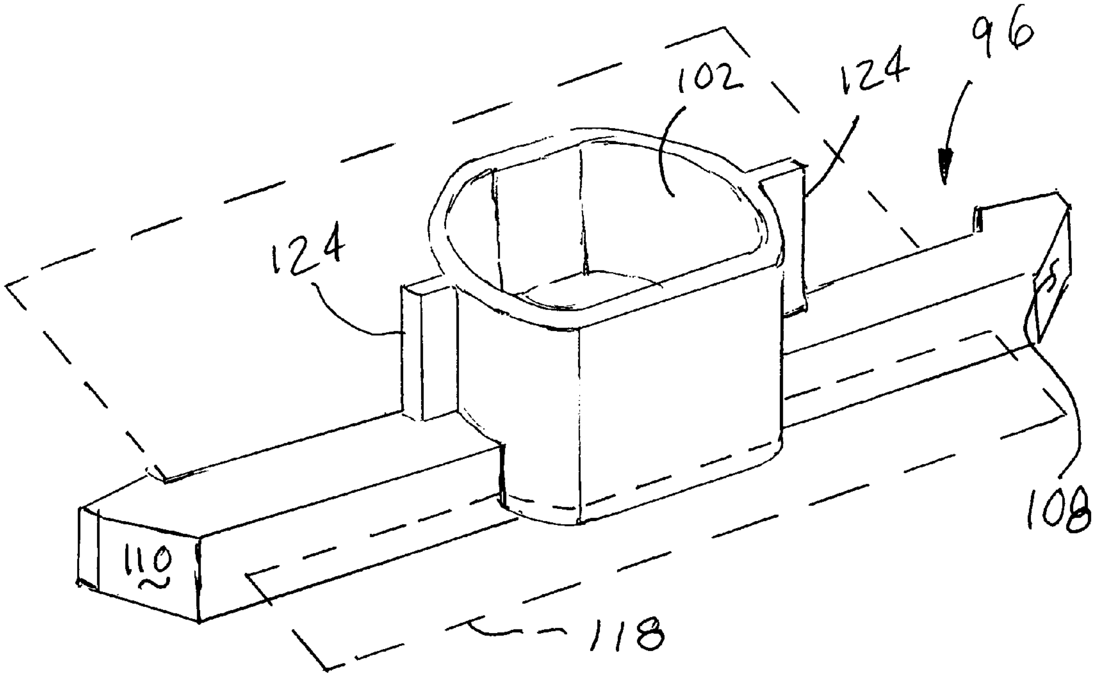
FIG. 16 is a perspective view of the light pipe from behind and above the light pipe.
Figure 17:
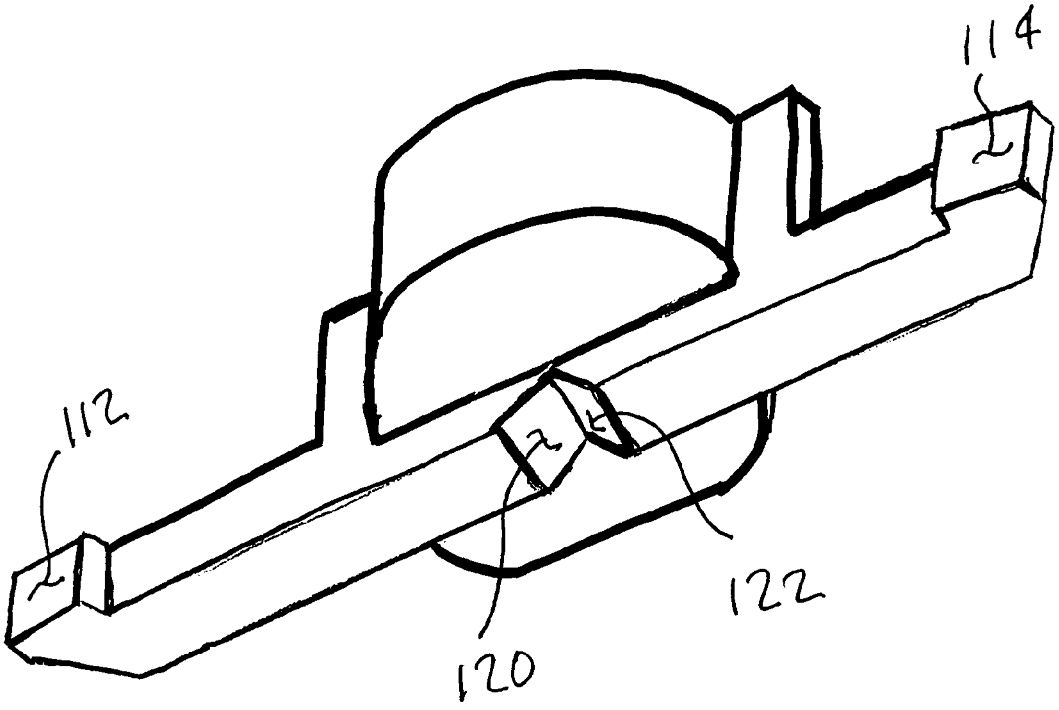
FIG. 17 is a perspective view of the light pipe from below and in front of the light pipe.

Referring now to FIG. 14, light pipe 96 provides a predetermined offset 107 between beams 76 and 78 exiting the light pipe 96. Offset 107 is achieved by using a second pair of reflecting surfaces 108 and 110 and a pair of refracting surfaces 112 and 114 to cause each of beams 76 and 78 to exit the light pipe at an angle 116 with respect to a first reference plane 118 of the light pipe 96. Plane 118 is shown end-on in FIG. 14 and in a perspective view in FIG. 16. Offset 107 provides the preferred spacing 90 between the illuminated spots 86 and 88 as illustrated in FIG. 8. Light pipe 96 also has a pair of flanges 124 useful for mounting light pipe 96 in a mounting frame 126, described infra, with respect to FIGS. 19 and 20.

Figure 18:
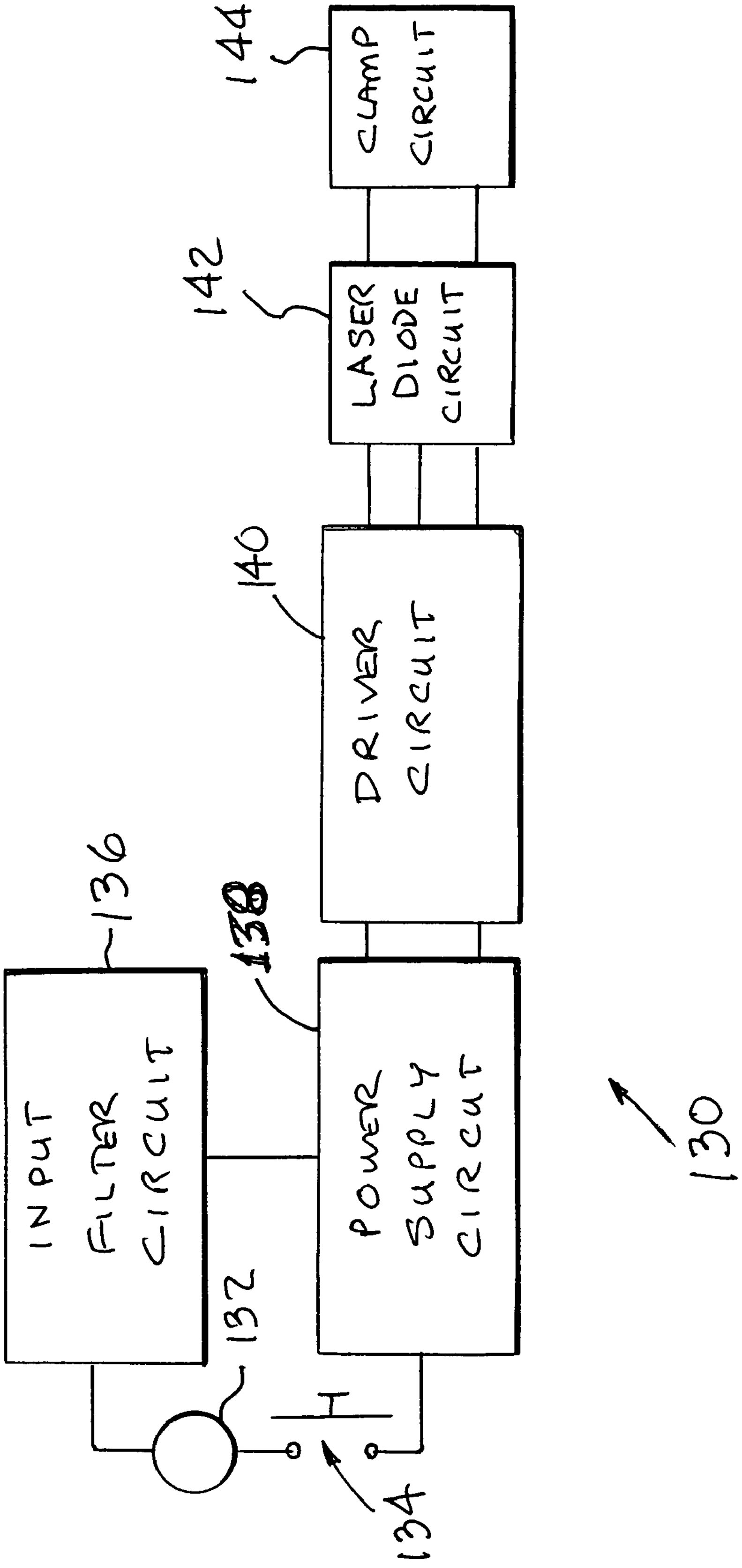
FIG. 18 is a block diagram for a power supply and driver circuit for the laser diode embodiments of the range finder.

Referring now to FIG. 18, a block diagram 130 of an electrical power supply system for the laser diode embodiments of the present invention may be seen. Power is supplied from an AC source or "MAINS" 132. An electrical contact or switch 134 in the trigger 72 closes a circuit to provide power to the system 130. An input filter circuit 136 reduces electrical transients that could otherwise adversely affect the remaining circuitry and light source 92 in the form of a laser diode. A power supply circuit 138 provides regulated DC power to a driver circuit 140 which operates a laser diode circuit 142, protected by a clamp circuit 144.

Figure 19:
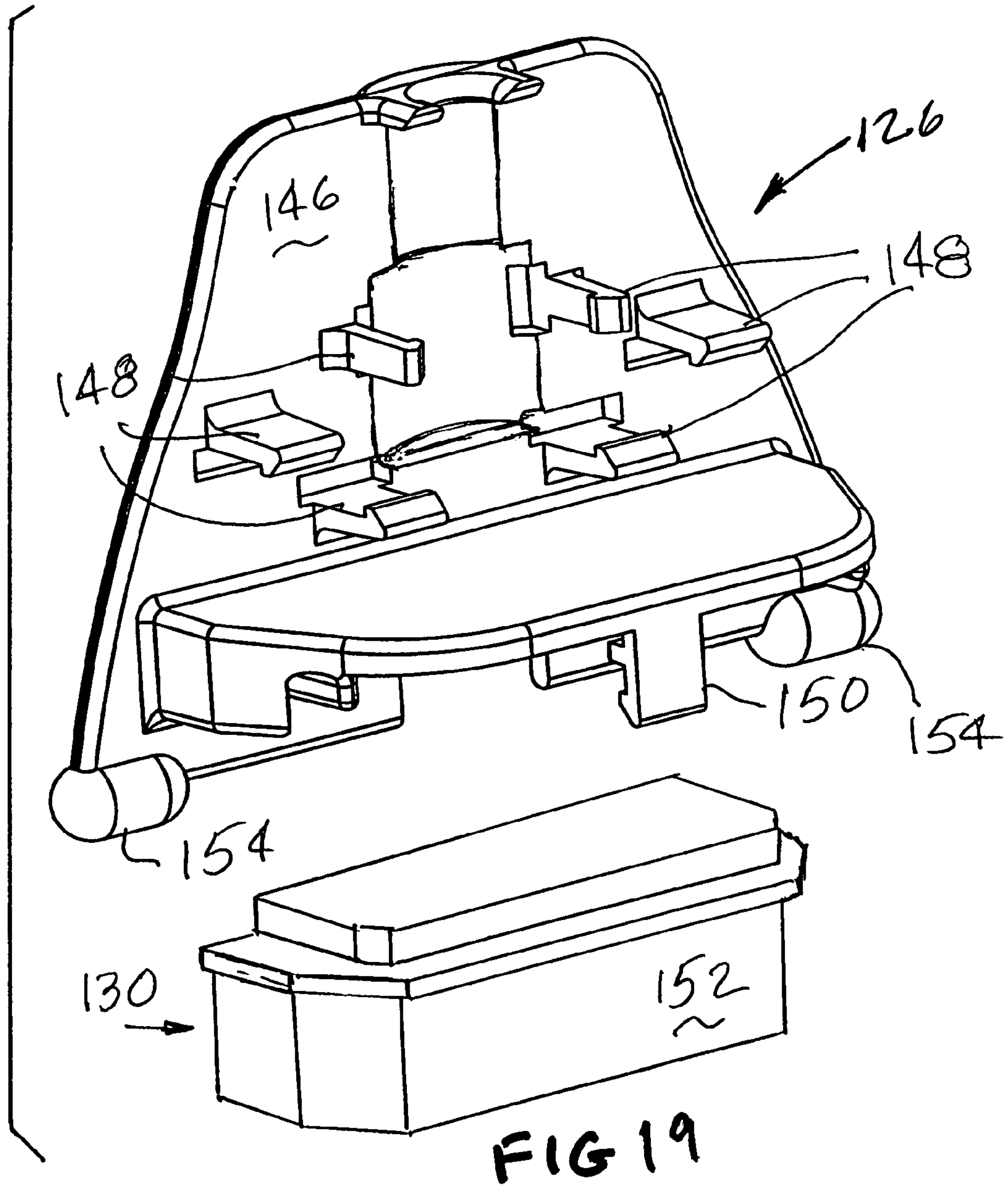
FIG. 19 is a perspective view of a mounting frame for the light pipe and laser diode, shown with a control module for the laser diode in an exploded view.
Figure 20:
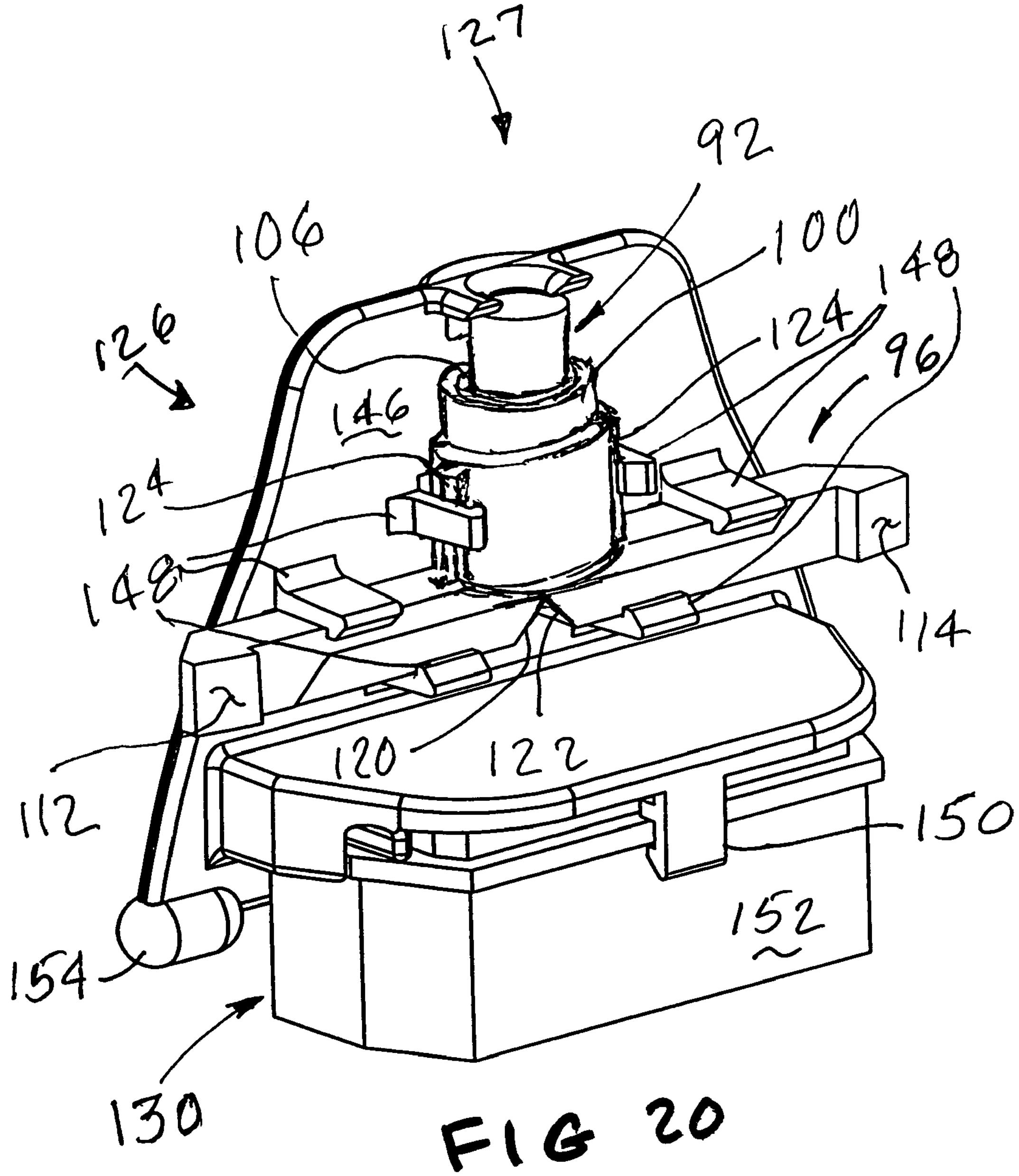
FIG. 20 is a perspective view of the mounting frame, light pipe and laser diode and control module assembled together.

Referring now to FIGS. 19 and 20, a mounting frame 126 for the light pipe 96 and driver circuit system 130 of this embodiment may be seen. A backplate 146 has a plurality of spring tabs 148 to hold light pipe 96 and a spring clip and spacer 150 to hold a module 152 containing system 130. A light beam assembly 127 is formed of mounting frame 126, light source 92, light pipe 96 and module 152. Enlarged bosses 154 may be received in mating receptacles (not shown) in respective halves of gun housing 68, along with other conventional alignment tabs or grooves to receive edges of the back plate 146 to align the assembly 127 in the spray gun 56.

Figure 21:
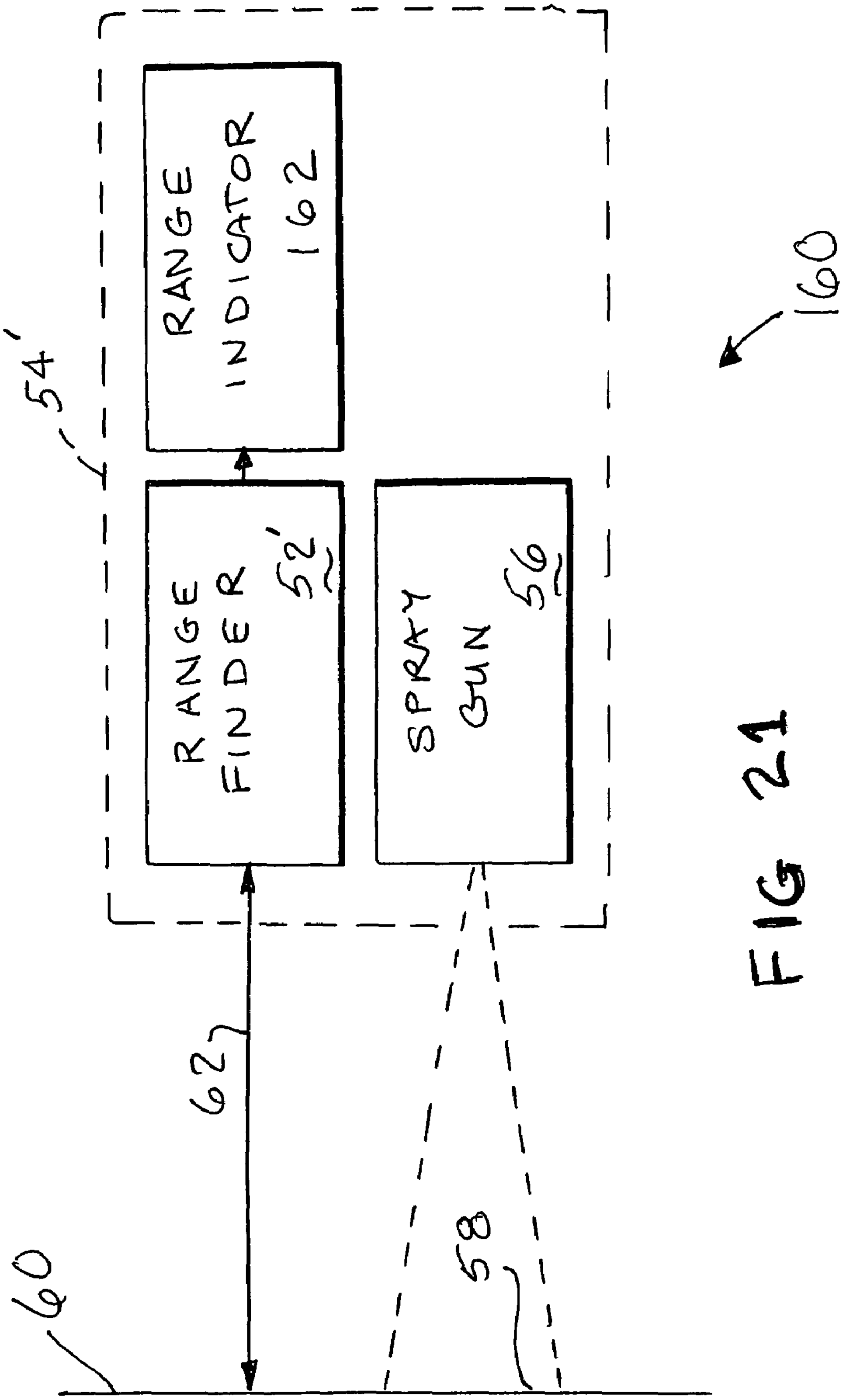
FIG. 21 is a simplified block diagram for several alternative embodiments of the present invention which include a range indicator.

Referring now to FIG. 21, a block diagram 160 of an alternative embodiment of the present invention may be seen. In this embodiment, a range indicator 162 is added to the assembly 54, and a range finder 52' provides distance information to the user via a perceptible signal from the range indicator 162, rather than illuminating the target surface with a visually perceptible image. As may be seen in FIG. 22, the range indicator 162 may have an audio output device 164 providing an audible output, preferably with three distinguishable states, such as pulsing, steady, warbling, or multiple tones. For example, a high tone followed by a low tone can be used to indicate “move closer” and a low tone followed by a high tone can indicate “move away” and silence can indicate that the gun is at the desired distance. Alternatively, a visual display for the range indicator 162 can take the form of a bar graph display 166, with one or more bars used to indicate the desired correction to make to position the gun at the desired distance. With the example shown, three bars can be illuminated to indicate the gun is at the desired distance and fewer bars illuminated indicating the gun is closer than the desired distance and more bars illuminated indicating the gun is farther than the desired distance from the target surface. If it is preferred to illuminate only one bar at a time, an odd number of bars will allow a median bar to indicate the gun is at the desired distance, while having a symmetrical range of possible indications on either side of that state.

Figure 23:
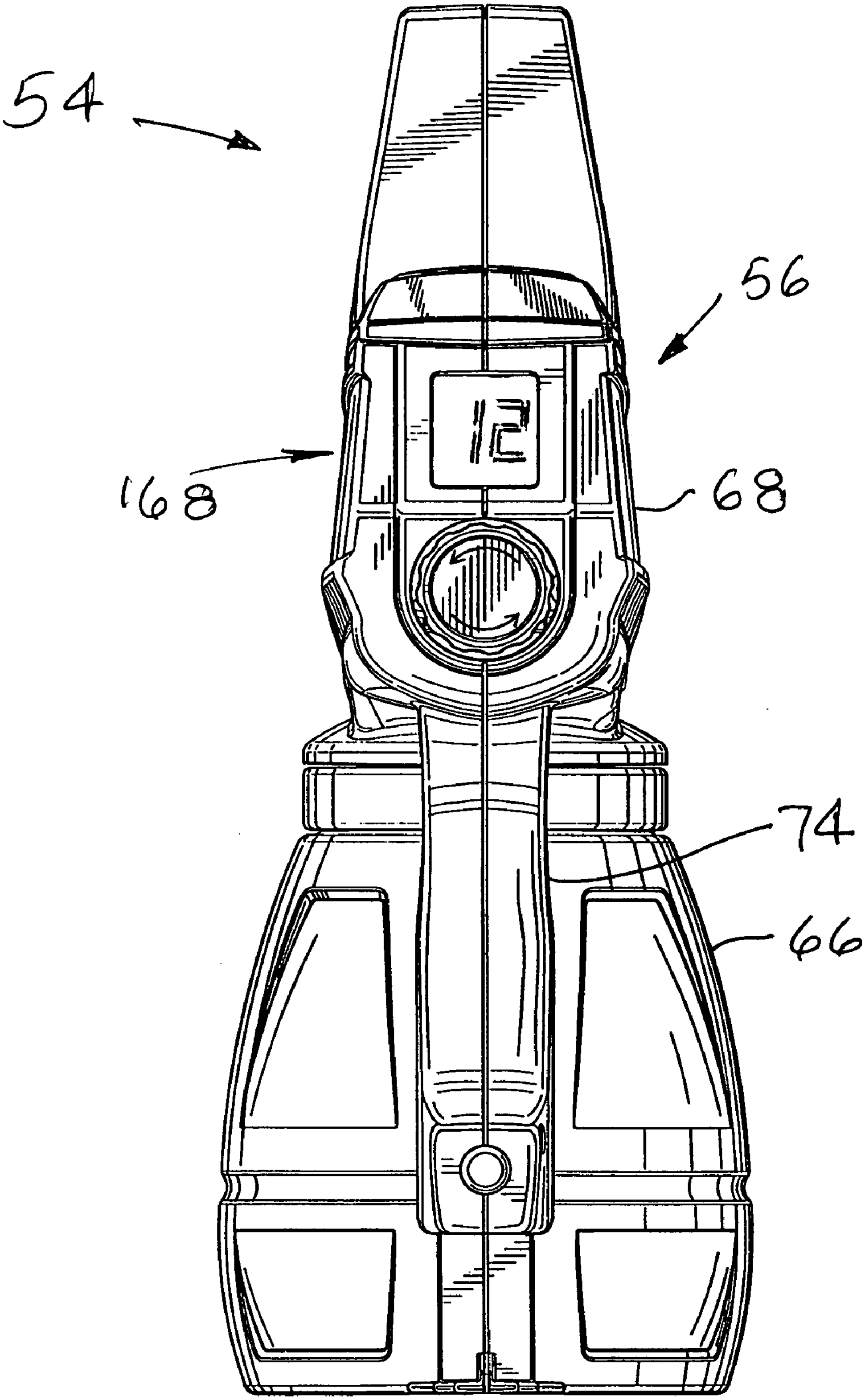
FIG. 23 is a view of the rear of the spray gun with one alternative range indicator.

Referring now also to FIG. 23, other visual range indicators may include a digital display of the distance 62, for example, in inches, with the preferred reading being “12” for example, using a two digit decimal display 168. Alternatively, a three state alphabetic message may be displayed, such as indicating “TOO CLOSE” or “OK TO SPRAY” or “TOO FAR AWAY” in place of the two decimal digits.

Figure 22:
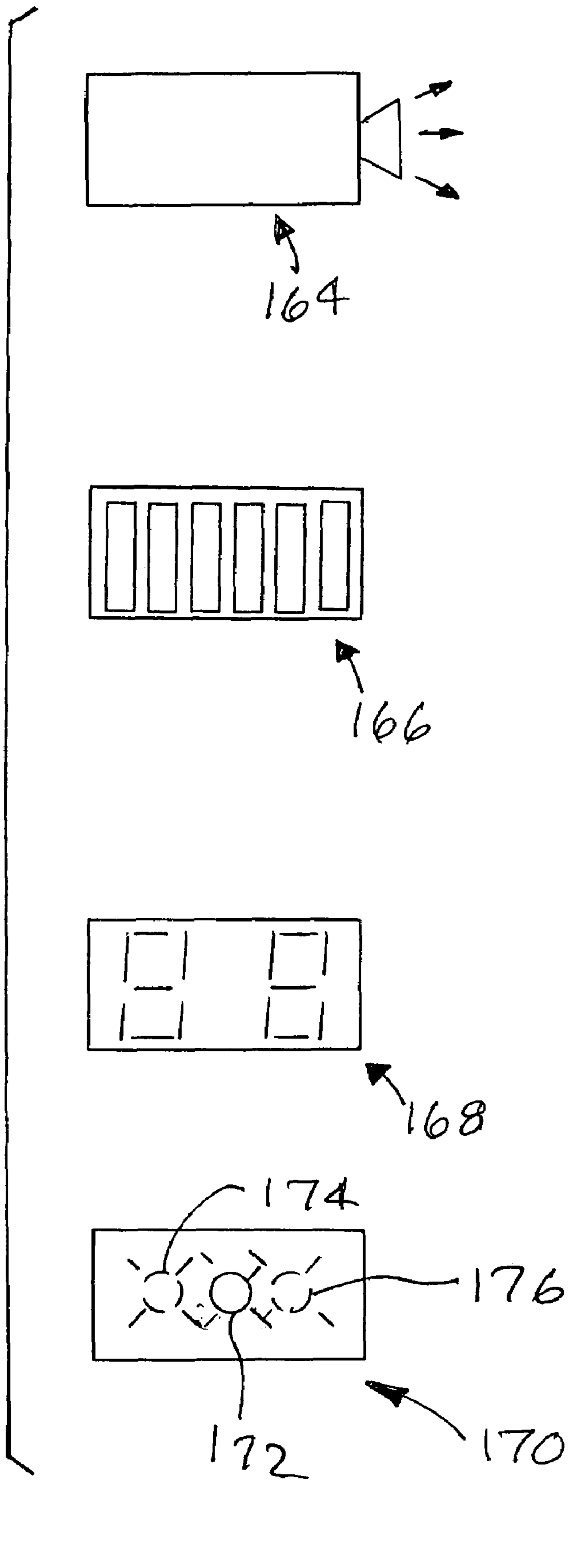
FIG. 22 is a simplified view of various range indicators useful in connection with the system shown in FIG. 21.
Figure 24:
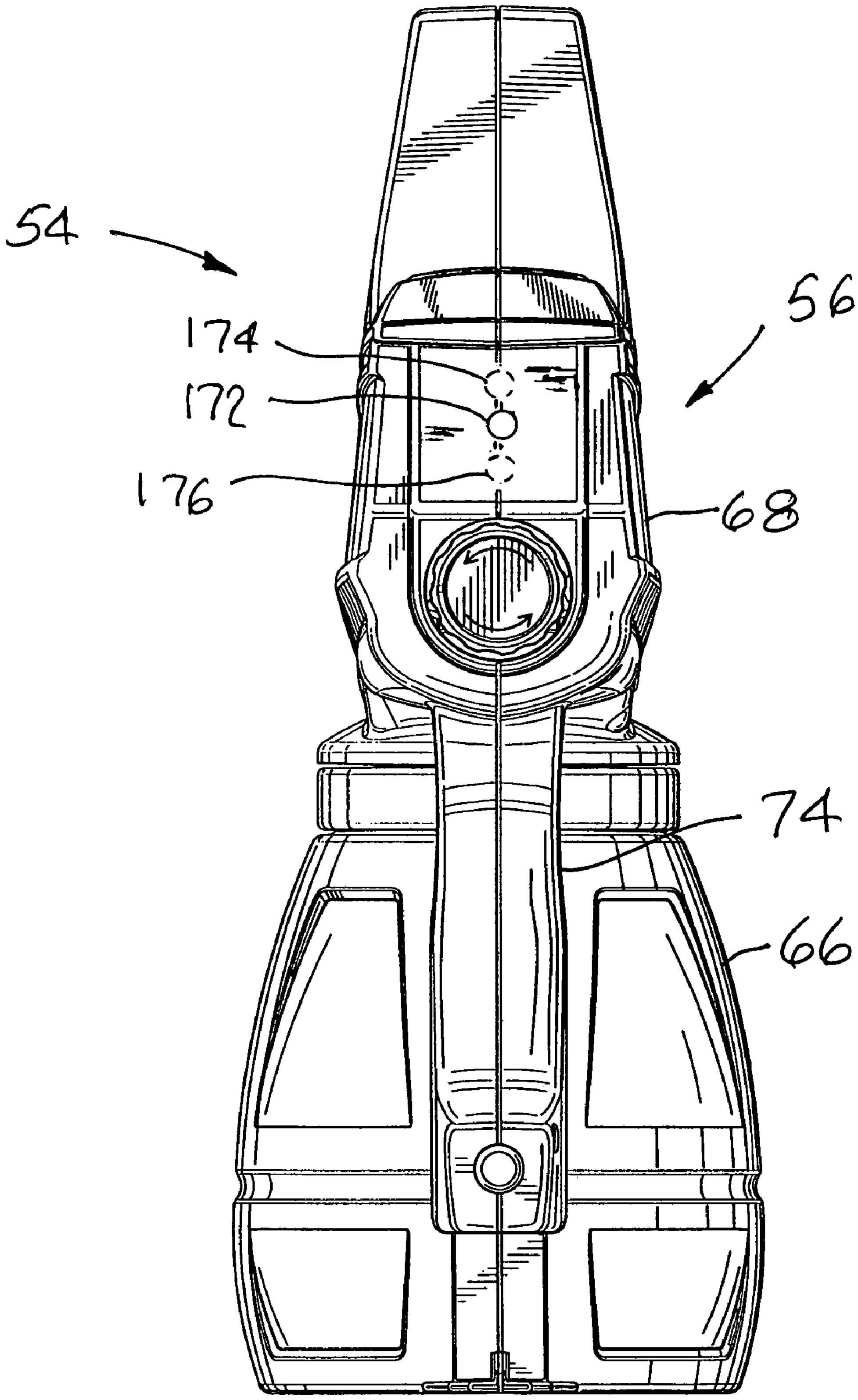
FIG. 24 is a view similar to that of FIG. 23, except illustrating other alternative range indicator embodiments.

Referring now also to FIG. 24, another version of the range indicator 162 may be a single or multiple element visual indicator 170, such as an LED, with three states. With a single LED 172, the LED can be of the type having multiple color outputs with, for example steady RED indicating “too close”, flashing RED indicating “too far away” and GREEN indicating “ok to spray.” Alternatively, a YELLOW or other color may be used for the third state. With a multiple indicator version, operation similar to the bar graph indicator may be displayed, or only one of the indicators may be illuminated to indicate the relative position of the spray gun with respect to the target surface. In FIGS. 22 and 24, a single indicator 172 is shown by a solid line, while second and third indicators are shown in dashed lines as optional to this version of the range indicator 162.

Figure 25:
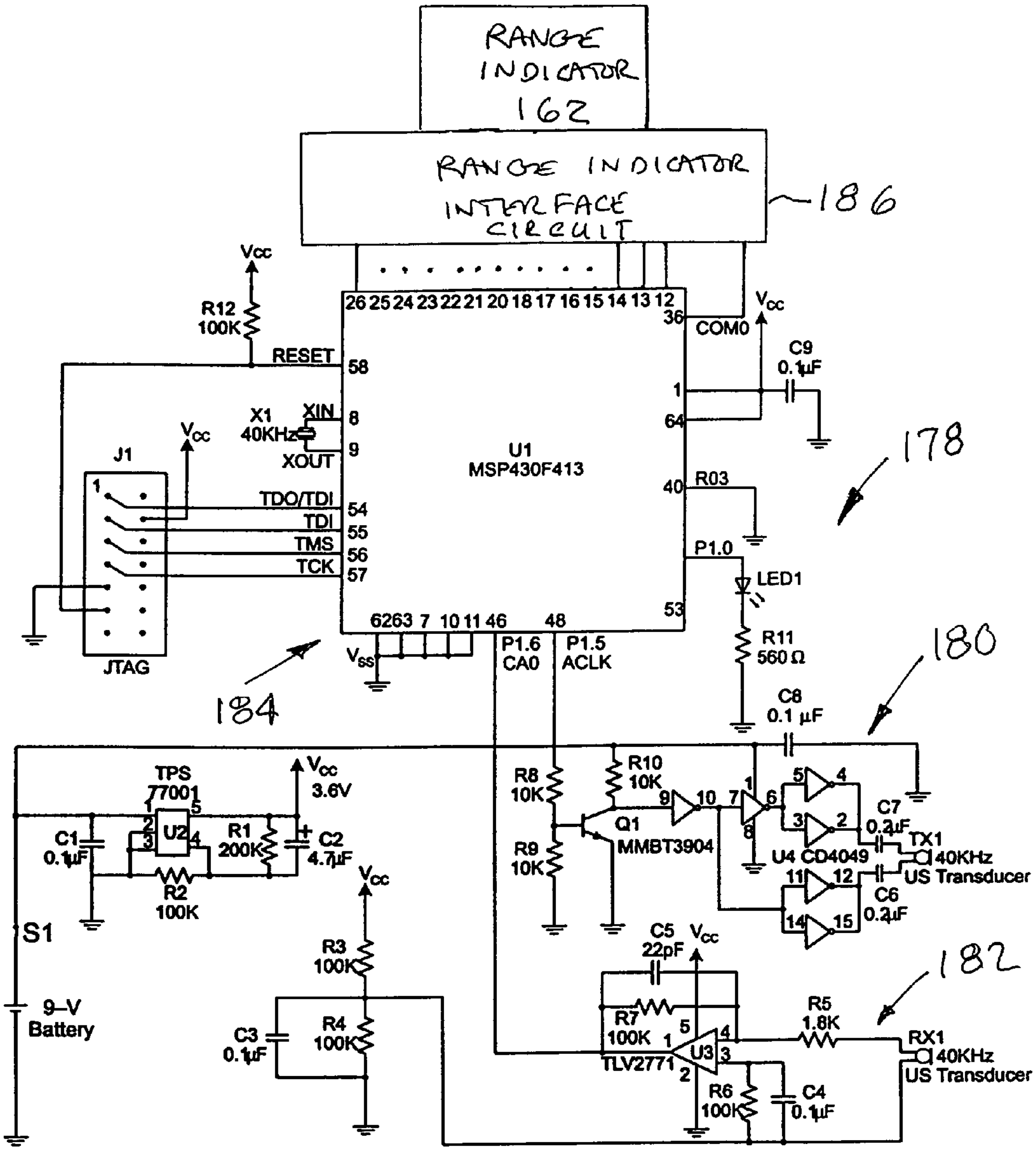
FIG. 25 is an electrical schematic corresponding to the block diagram of FIG. 21.

Referring now to FIG. 25, an example circuit schematic 178 for the range finder 52' and range indicator 162 of the embodiment of FIG. 21. In the range finder 52' a transmitter and driver 180 sends an ultrasonic pulse from the gun to the target surface 60, and a receiver transducer and amplifier 182 “listens' for the return echo. A microprocessor 184 computes the distance 62 that the gun is away from the target surface by measuring the time the surface 60 takes to return the echo, and computing the distance based on the measured time, as is conventional in such ultrasonic range finder circuits. The microprocessor interfaces with the range indicator 162 via range indicator interface circuit 186, which is also conventional.

Figure 26:
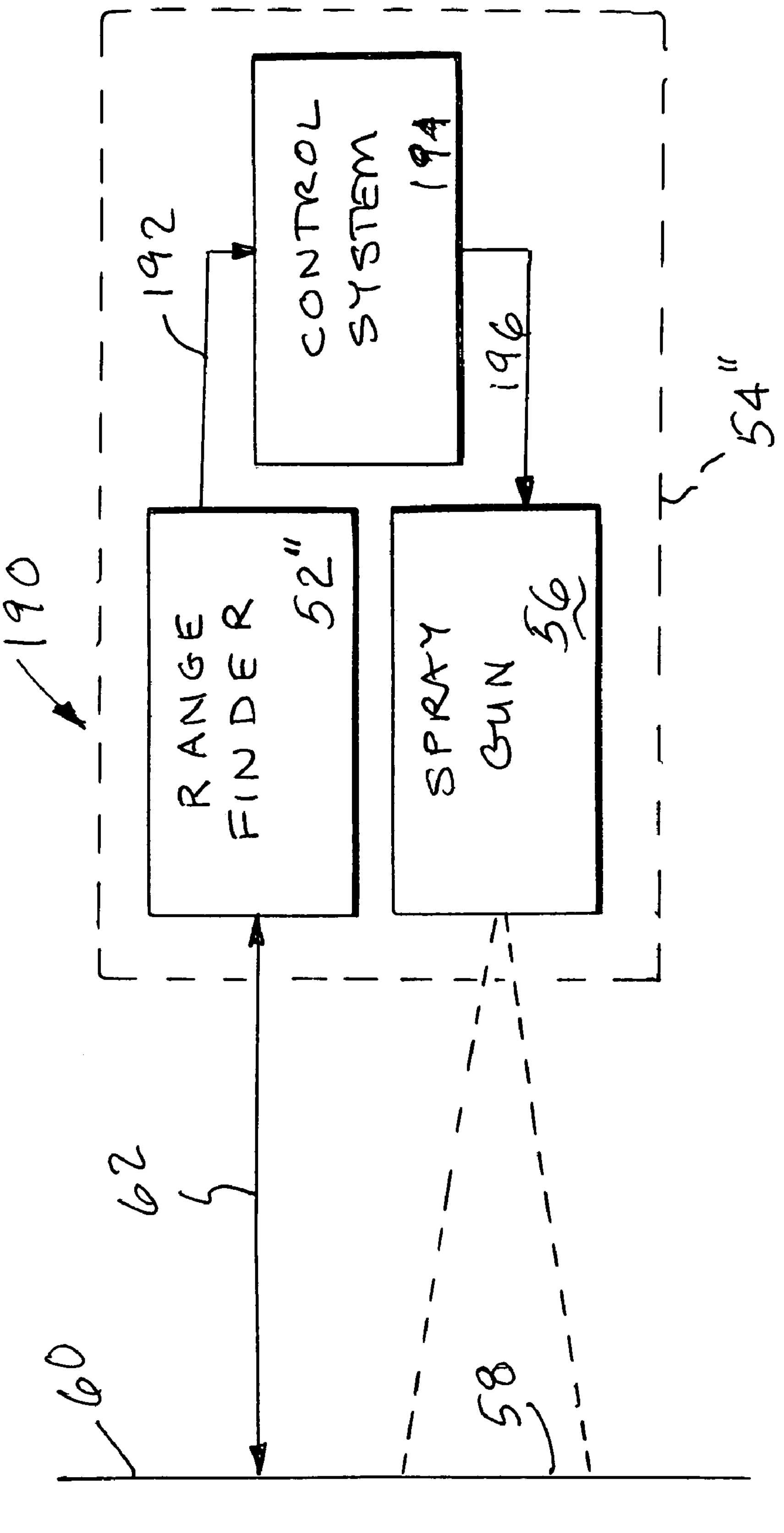
FIG. 26 is a simplified block diagram of a still further alternative embodiment of the present invention including a control system having an input from the range finder and an output connected to the spray gun.

Referring now to FIG. 26, a block diagram 190 for a further alternative embodiment of the present invention may be seen. In this embodiment, a range finder 52" is used to determine the distance 62 to the target surface 60 and provide a control signal on line 192 to a control system 194 which enables operation of gun 56 via control line when the distance 62 is found to be equal to the desired distance for spraying. In this embodiment, gun 56 may be disabled when the gun is not at the desired distance to the target surface, but it is also to be understood that some indication is preferred to be given to the user to provide guidance as to which direction to move the gun to enable operation.

Figure 27:
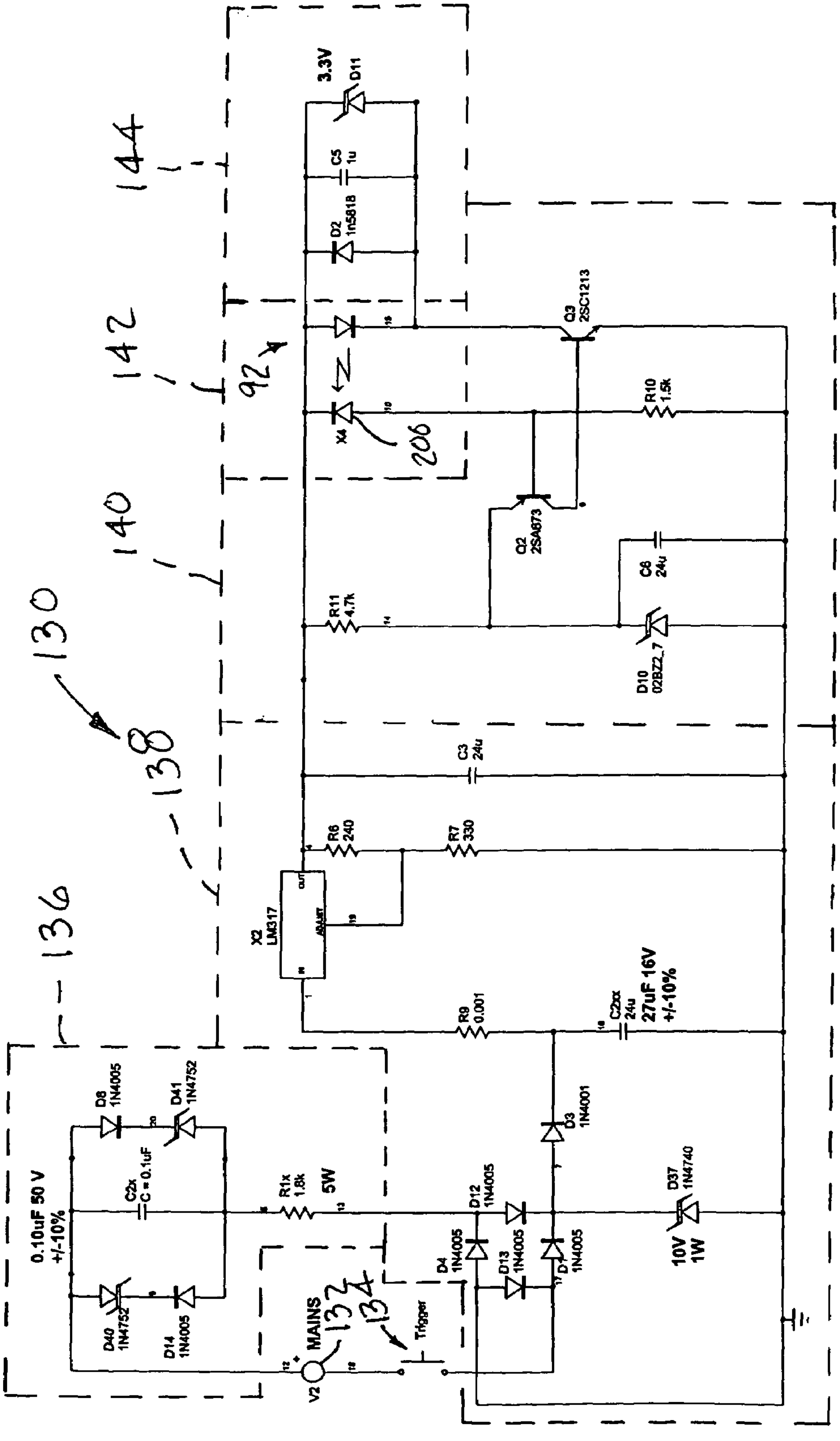
FIG. 27 is an electrical schematic corresponding to the block diagram of FIG. 18.

FIG. 27 shows a detailed electrical schematic corresponding to the block diagram of FIG. 18, for the power supply system to drive the laser diode of the embodiment first described above. It is to be understood that the laser diode light source 92 preferably includes a photo receptor device which regulates the laser light output using transistors 202 and 204. Clamp circuit 144 prevents reverse and overvoltage conditions from being applied to the light source 92.

Referring now to FIGS. 28–47, an alternative embodiment of the present invention using a pair of laser diodes will be described. In the embodiment which follows, it is to be understood that the block diagram of FIG. 18 and the schematic of FIG. 27 or similar systems and circuits may be used to power each of the two laser diodes used in this embodiment. The following embodiment operates in the same way as the first embodiment described above with respect to FIGS. 1–10, with the difference being that two laser diodes are used in place of one laser diode and the light pipe to provide the two beams 76 and 78.

Figure 28:
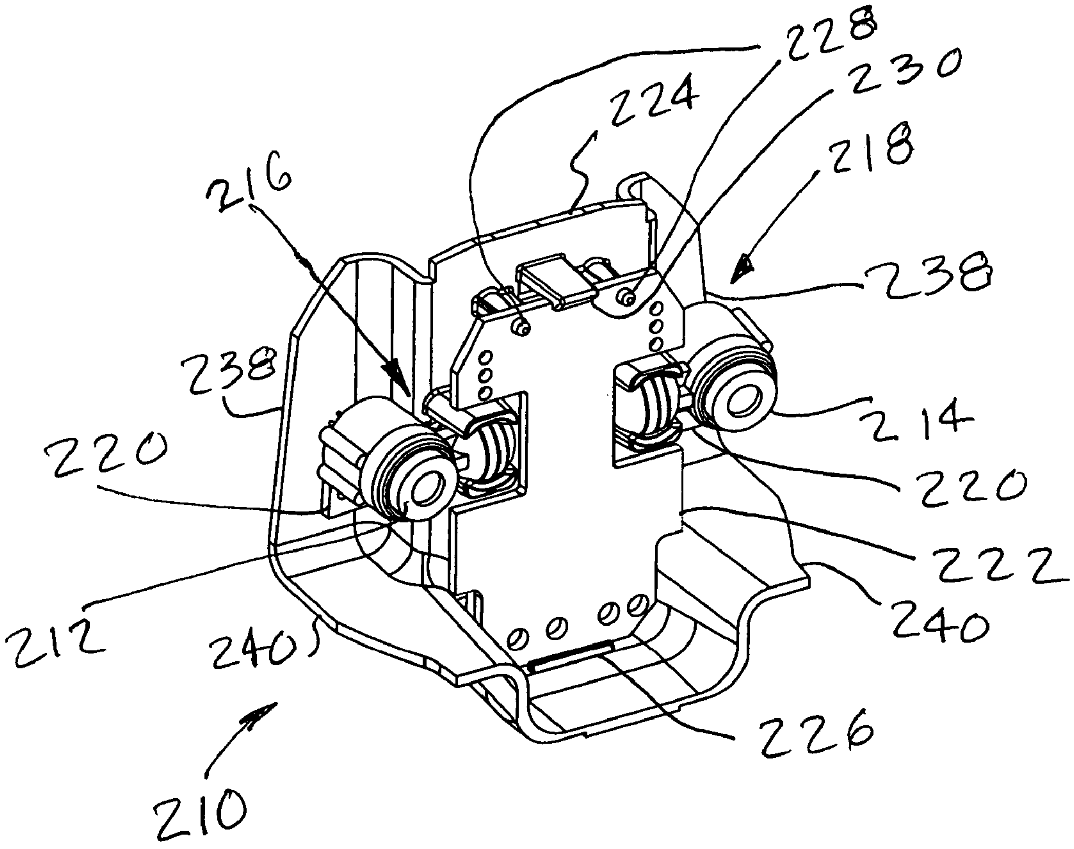
FIG. 28 is a perspective view of a subassembly for an embodiment of the present invention including a pair of laser diodes.

Referring first to FIG. 28, a dual laser light beam subassembly 210 may be seen. In this embodiment, assembly 210 replaces light beam assembly 127 shown in FIG. 20. For more brightness, and to avoid the complication and cost of producing the light pipe 96, two lights sources, preferably in the form of separate laser diodes 212 and 214 provide the light beams 76 and 78, respectively. Subassembly 210 holds the laser diodes via separate ball-joint mounting heads 216 and 218, to allow aiming the beams 76 and 78 before the assembly 210 is installed in the gun 56. Each laser diode may be mounted on a respective printed circuit board 220 and a main printed circuit board 222 may contain circuitry identical or similar to that shown in FIG. 27 for each of the laser diodes 212 and 214. Components on board 222 and wiring between boards 220 and 222 have been omitted, for clarity of presentation.

Figure 29:
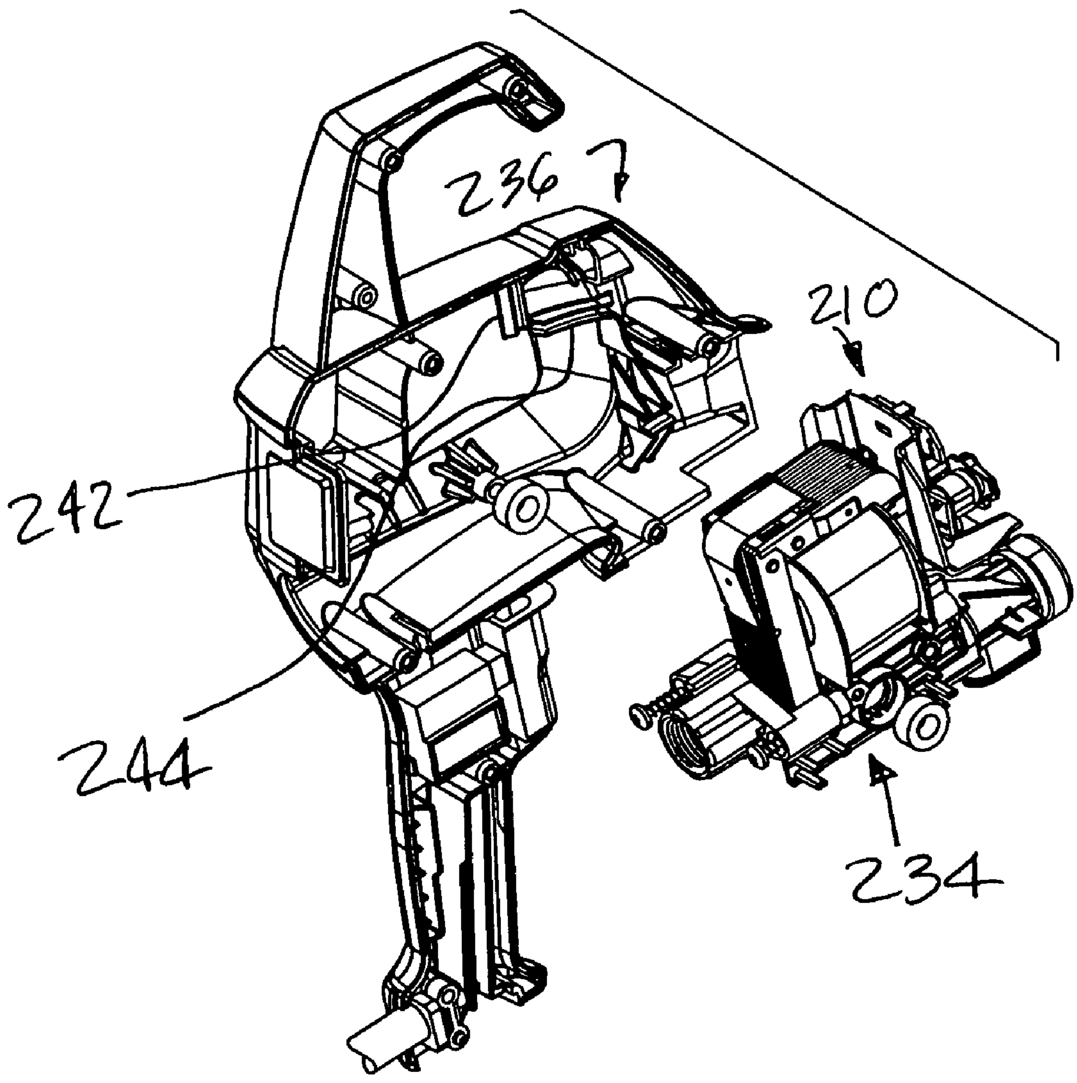
FIG. 29 is a perspective view of the subassembly of FIG. 28 along with an armature for pressurizing paint, shown with a gun housing half to illustrate assembly details of this embodiment of the present invention.

Referring now also to FIGS. 30, 32, 33 and 36, the board 222 is located and retained on a back plate 224 by a lip 226, a pair of posts 228 and a spring clip 230. Posts 228 are each received in corresponding mating apertures 232 in board 222. Once subassembly 210 is put together, tested and aligned (as described infra), the ball-joint mounting heads 216,218 are secured to the back plate 224 by applying solvent to the interface between the ball-joint mounting heads 216, 218 and back plate 224 and allowed to cure. The subassembly 210 is then placed together with an armature 234 and installed in the gun housing 68, preferably formed in two halves, with one half 236 as shown in FIG. 29. Side flanges 238 and bottom flanges 240 of back plate 224 are preferably received in between ridges 242, 244, respectively in the halves of gun housing 68 to positively locate subassembly 210 with respect to the spray gun 56.

Figure 31:
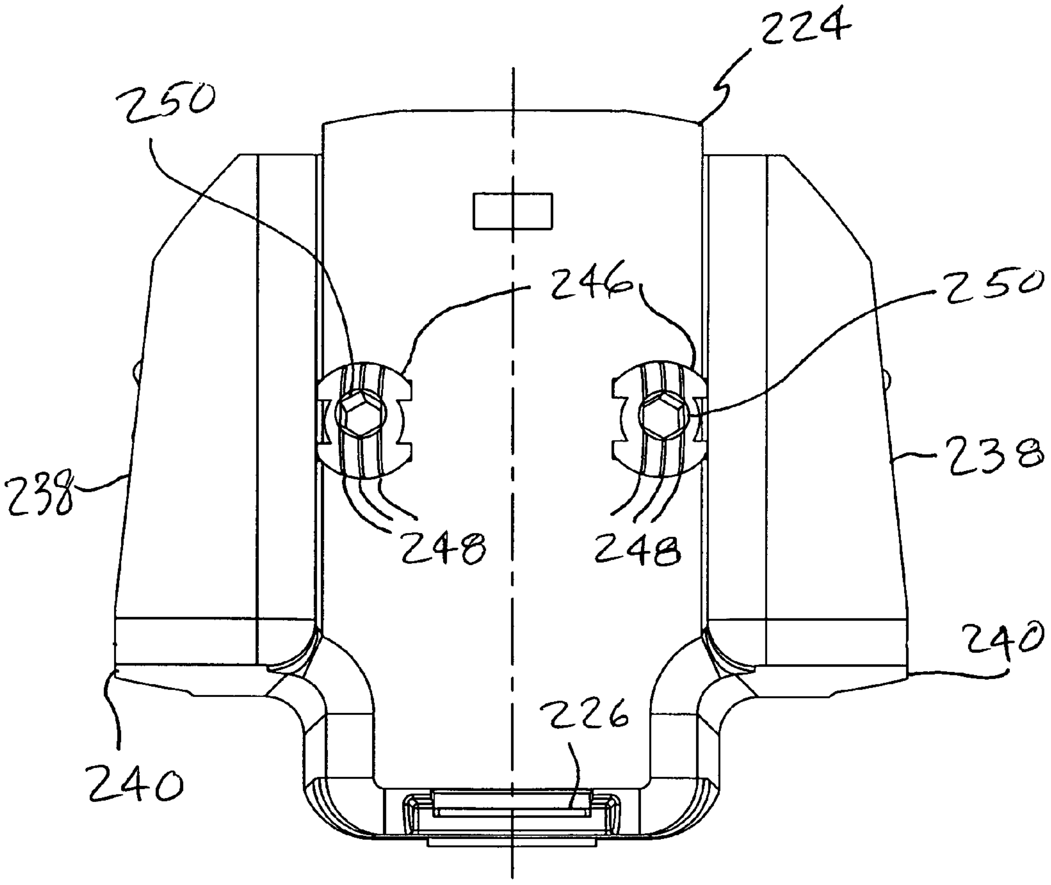
FIG. 31 is a back elevation view of the subassembly of FIG. 28.
Figure 32:
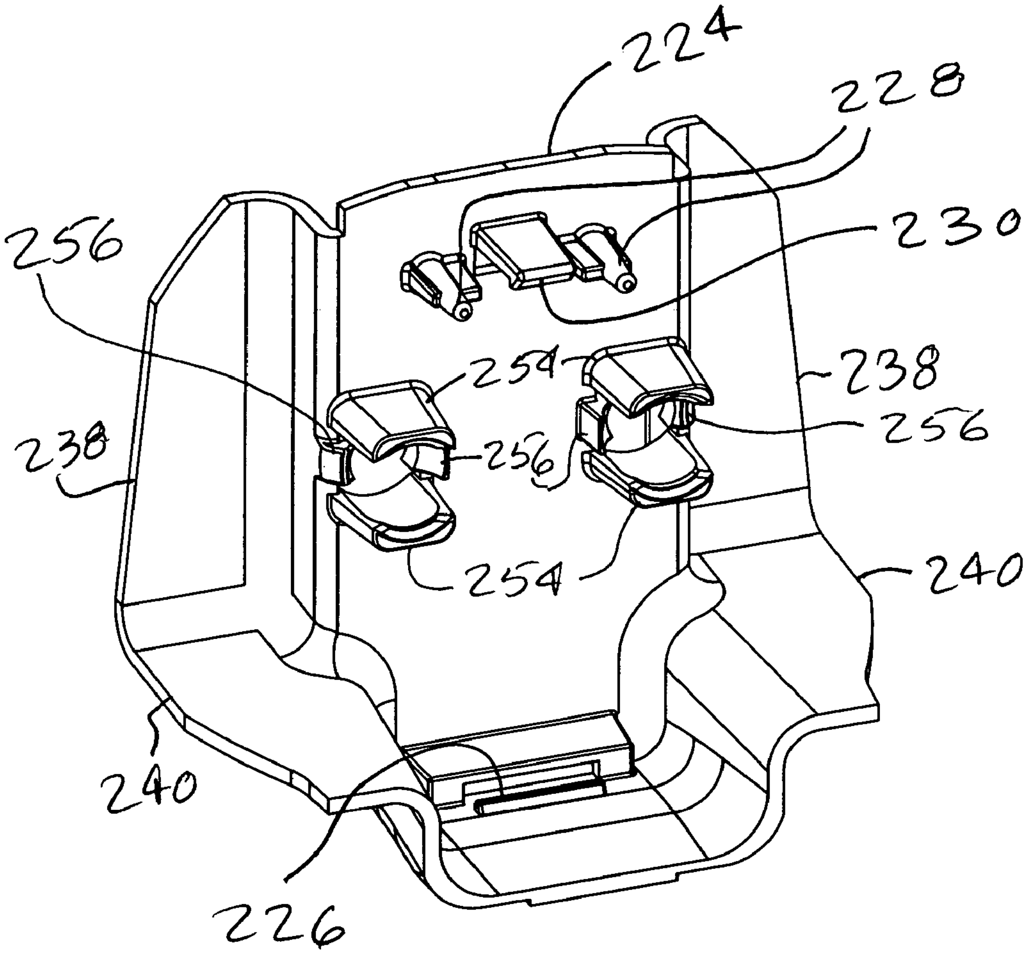
FIG. 32 is a perspective view of a mounting frame of the subassembly of FIG. 28.
Figure 33:
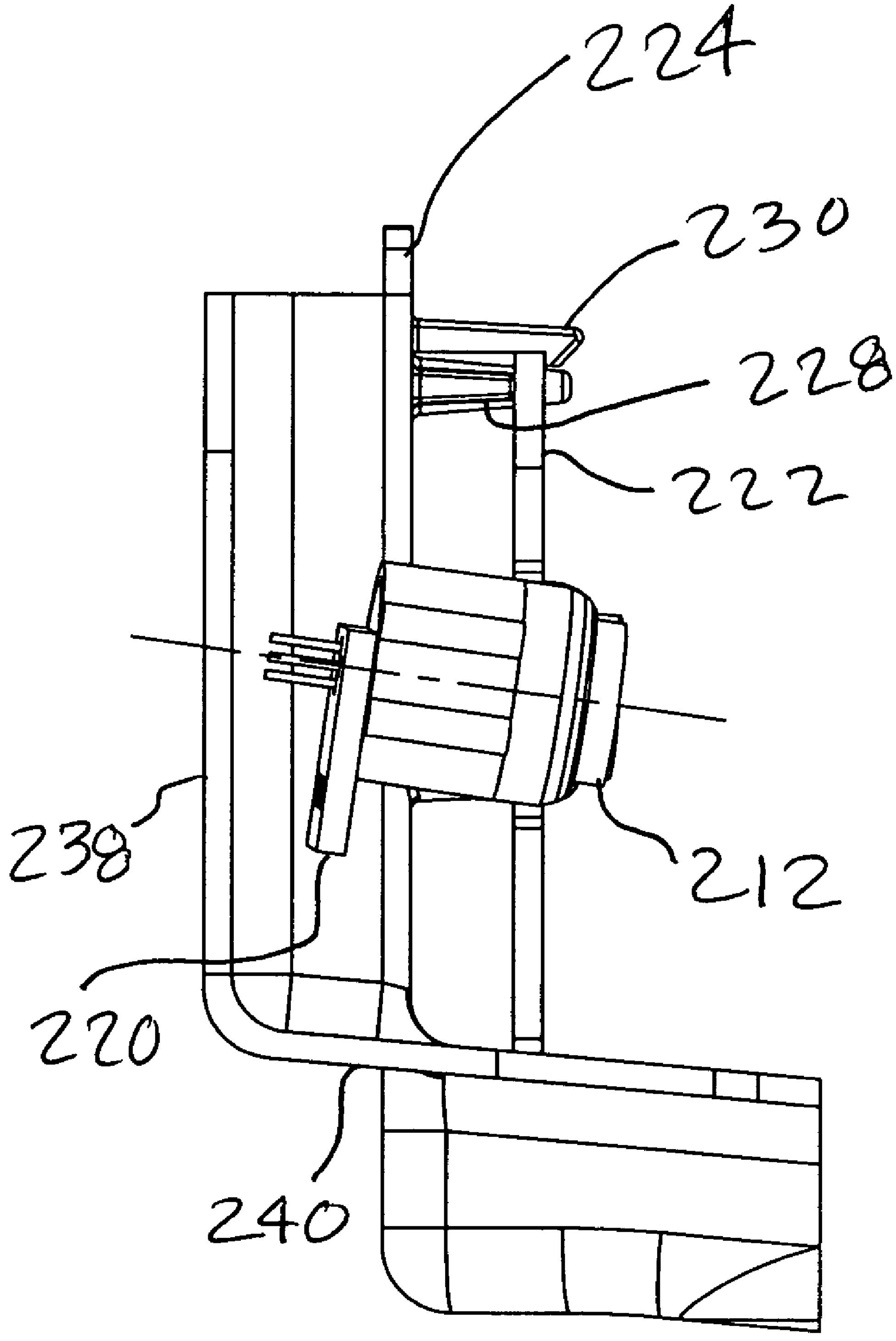
FIG. 33 is a side view of the subassembly of FIG. 28.
Figure 37:
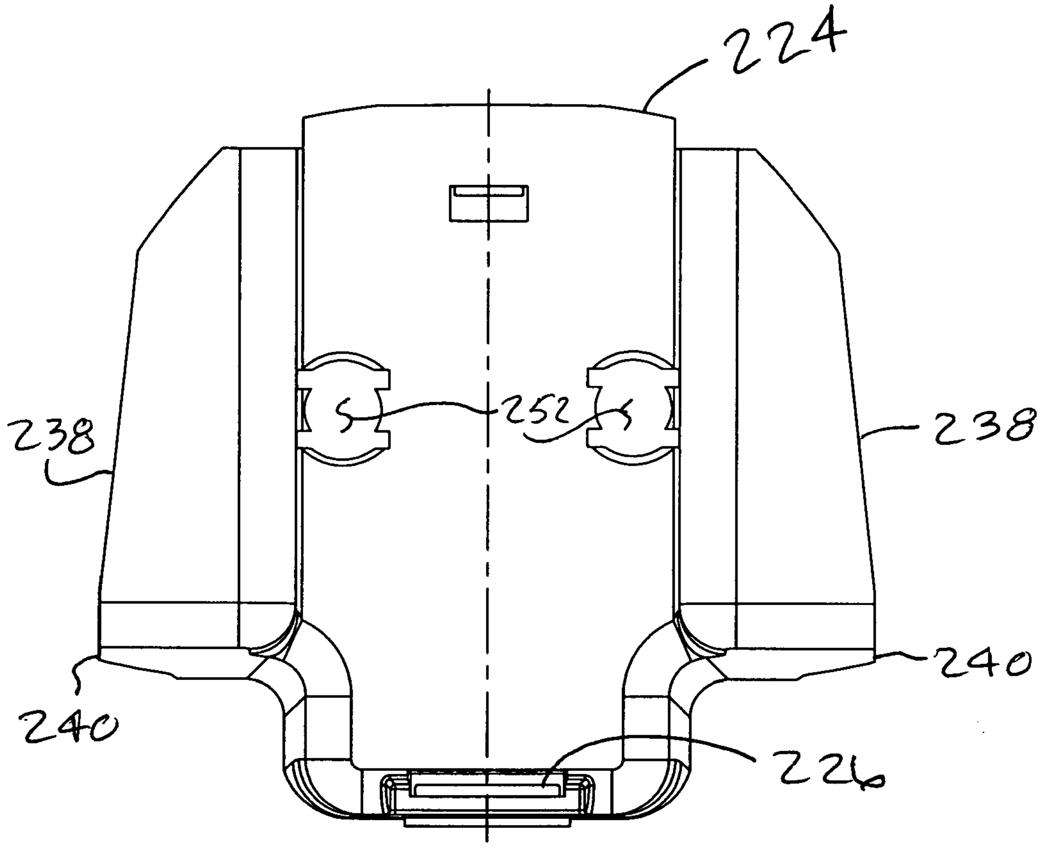
FIG. 37 is a back view of the mounting frame of FIG. 32.

FIGS. 31 and 37 show a rear view of the back plate 224 with and without the ball-joint mounting heads installed, respectively. As may be seen most clearly in FIG. 31, balls 246 of the ball-joint mounting heads 216, 218 each have a plurality of grooves 248 to assist the flow of solvent into the interface between the balls 246 and back plate 224. Additionally, balls 246 each have a hexagonal recess 250 facing the rear and accessible through apertures 252 when ball-joint mounting heads are installed in back plate 224.

Referring to FIGS. 32, 36, 39 and 40, balls 246 are retained by projections 254 and 256 in back plate 224. Until secured by solvent, balls 246 are held in position, but are relatively free to be rotated within projections 254 and 256.

Figure 35:
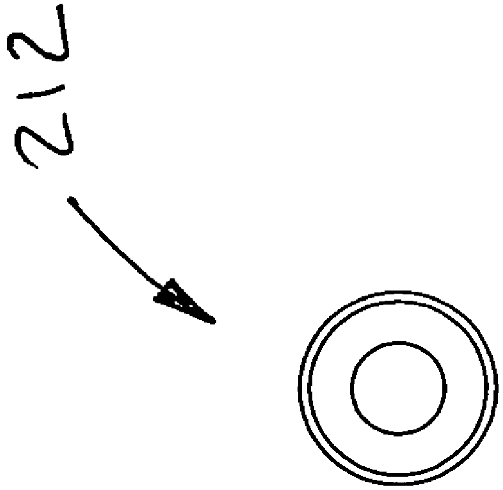
FIG. 35 is a front view of the laser diode of FIG. 34.
Figure 34:
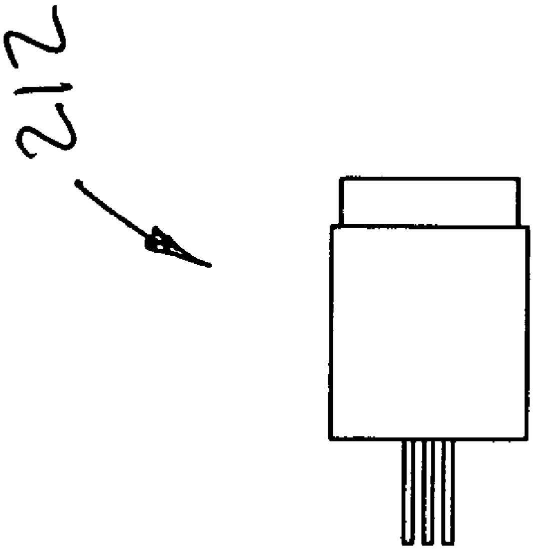
FIG. 34 is a side view of a laser diode useful in certain embodiments of the present invention.

Referring now to FIGS. 34 and 35, laser diode 212 is shown in a side and front view, it being understood that laser diode 214 is preferably identical in dimensions to diode 212. Diodes 212 and 214 are preferably part no. EL-201, available from E-Laser Enterprise Co., Ltd. of Taiwan. It is to be understood, that other laser diodes may be used while still remaining within the scope of the present invention. For example and not by way of limitation, lasers 212 and 214 may emit different colors from each other, if desired. Furthermore, in the practice of the present invention with respect to the embodiments related to FIG. 21, a non-visible wavelength laser may be used in connection with the range finder 52'.

Figure 36:
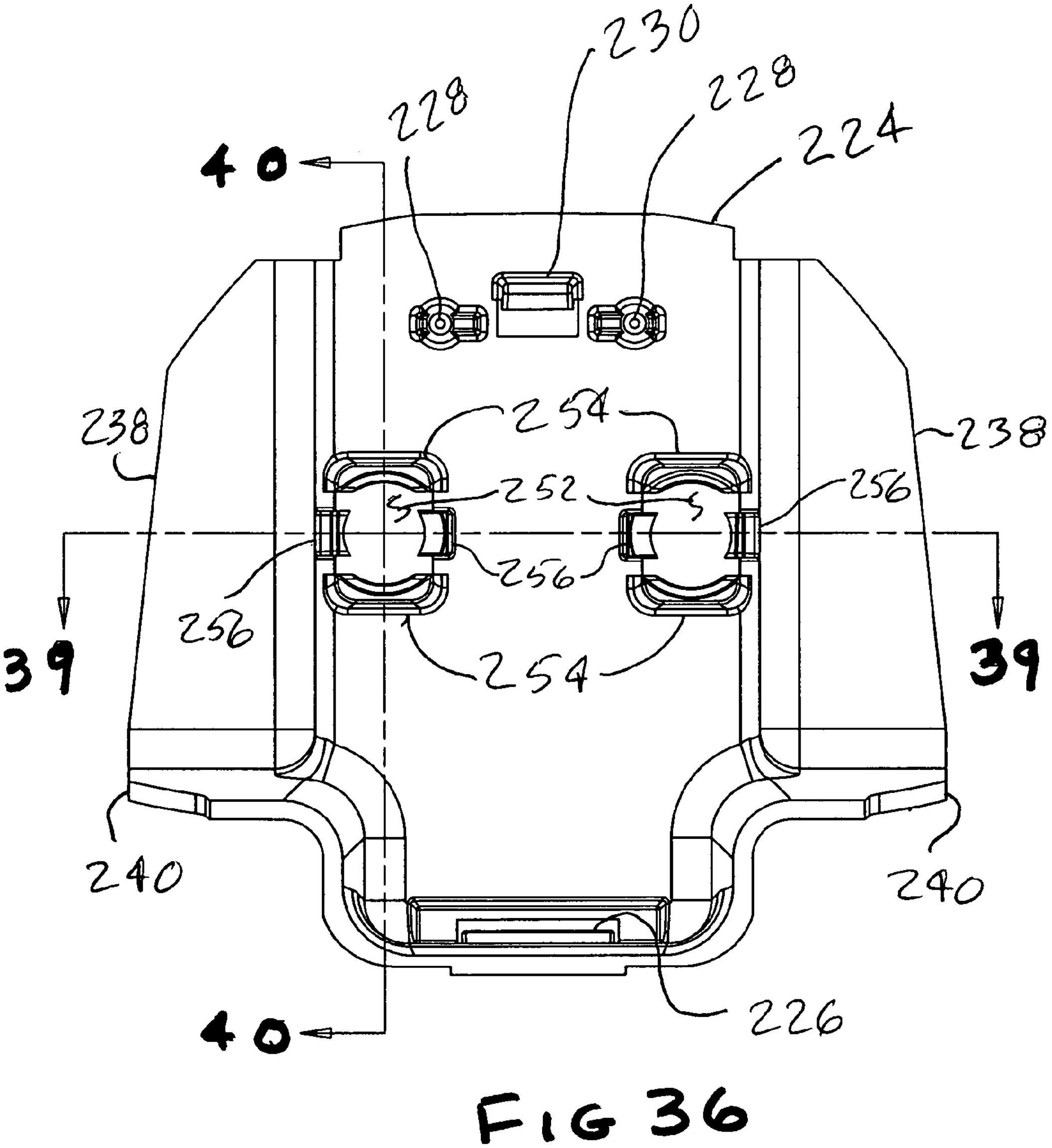
FIG. 36 is a front view of the mounting frame of FIG. 32.
Figure 38:
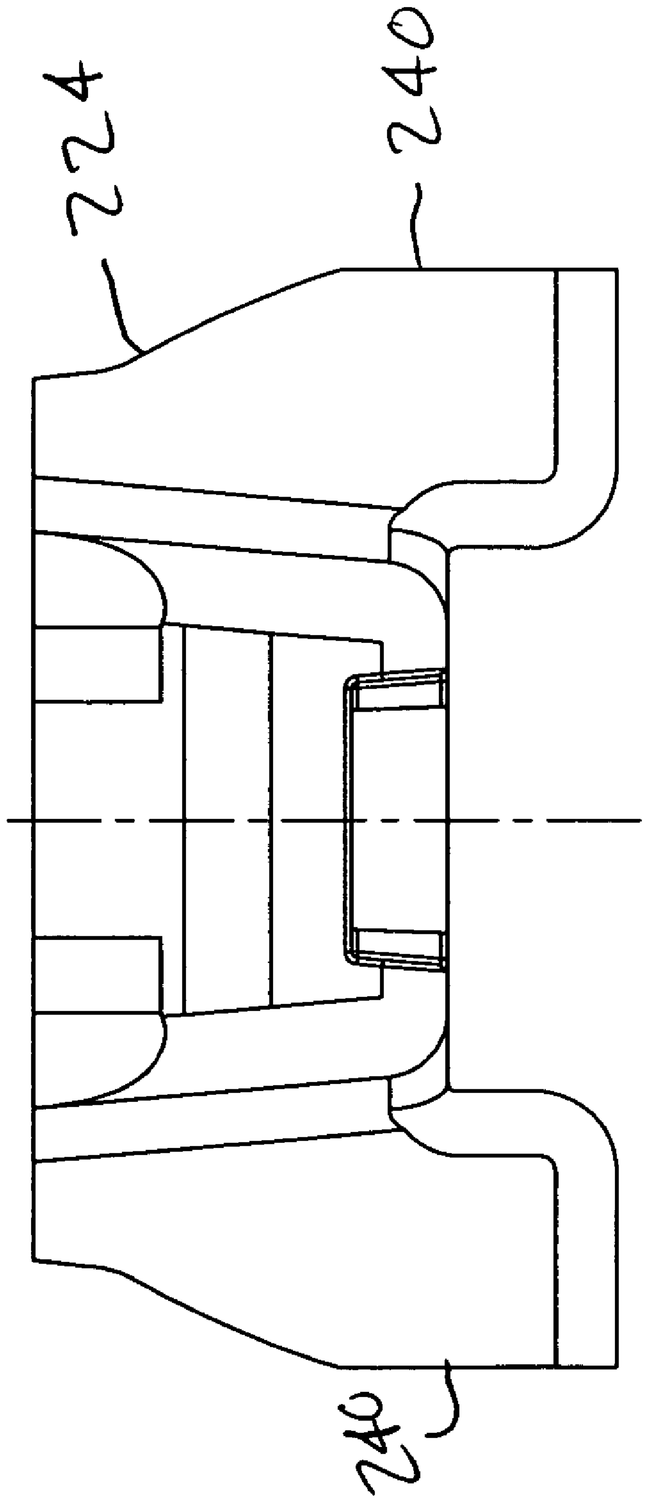
FIG. 38 is a bottom view of the mounting frame of FIG. 32.
Figure 39:
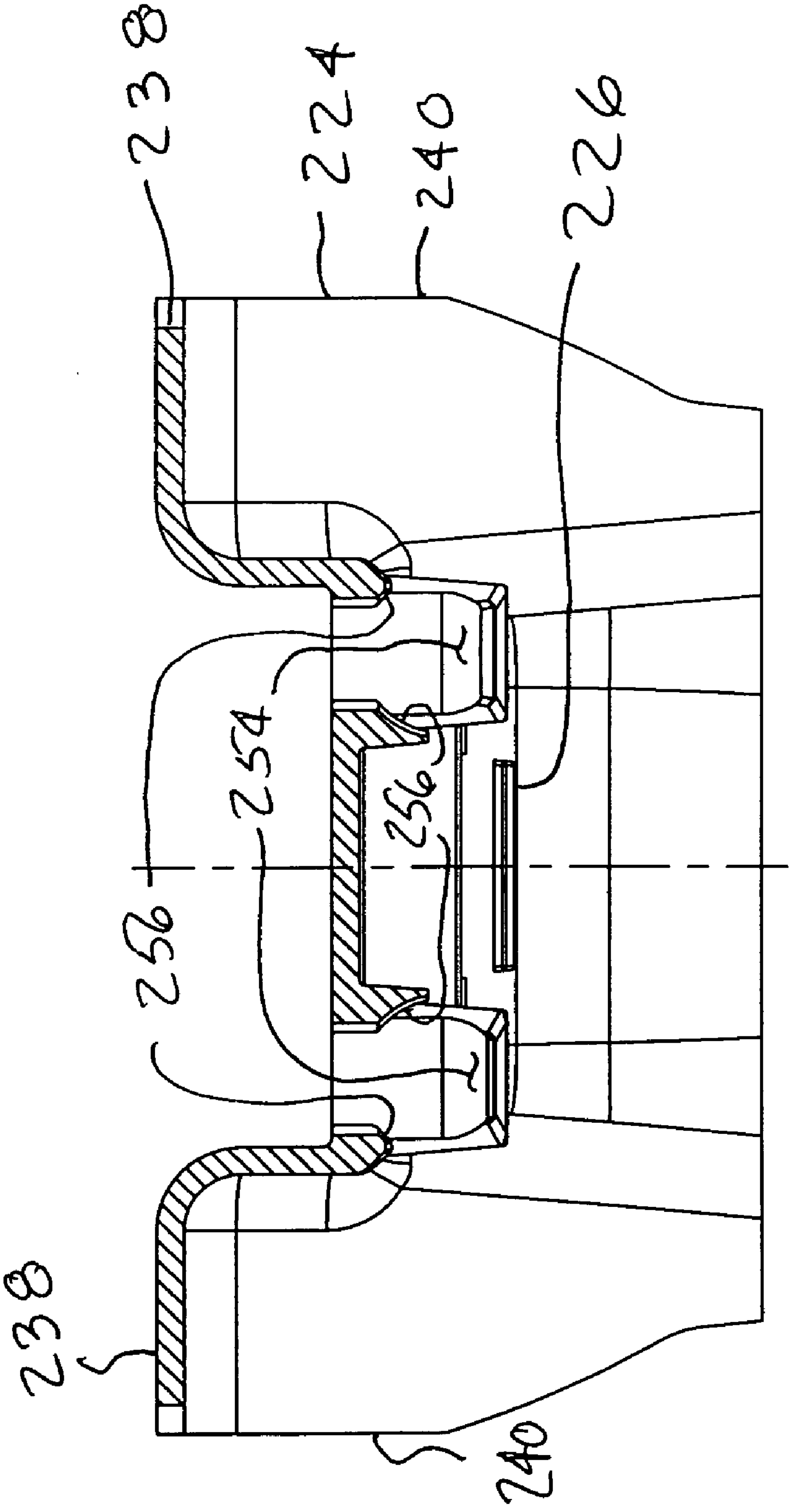
FIG. 39 is a section view of the mounting frame taken along line 39—39 of FIG. 36.
Figure 40:
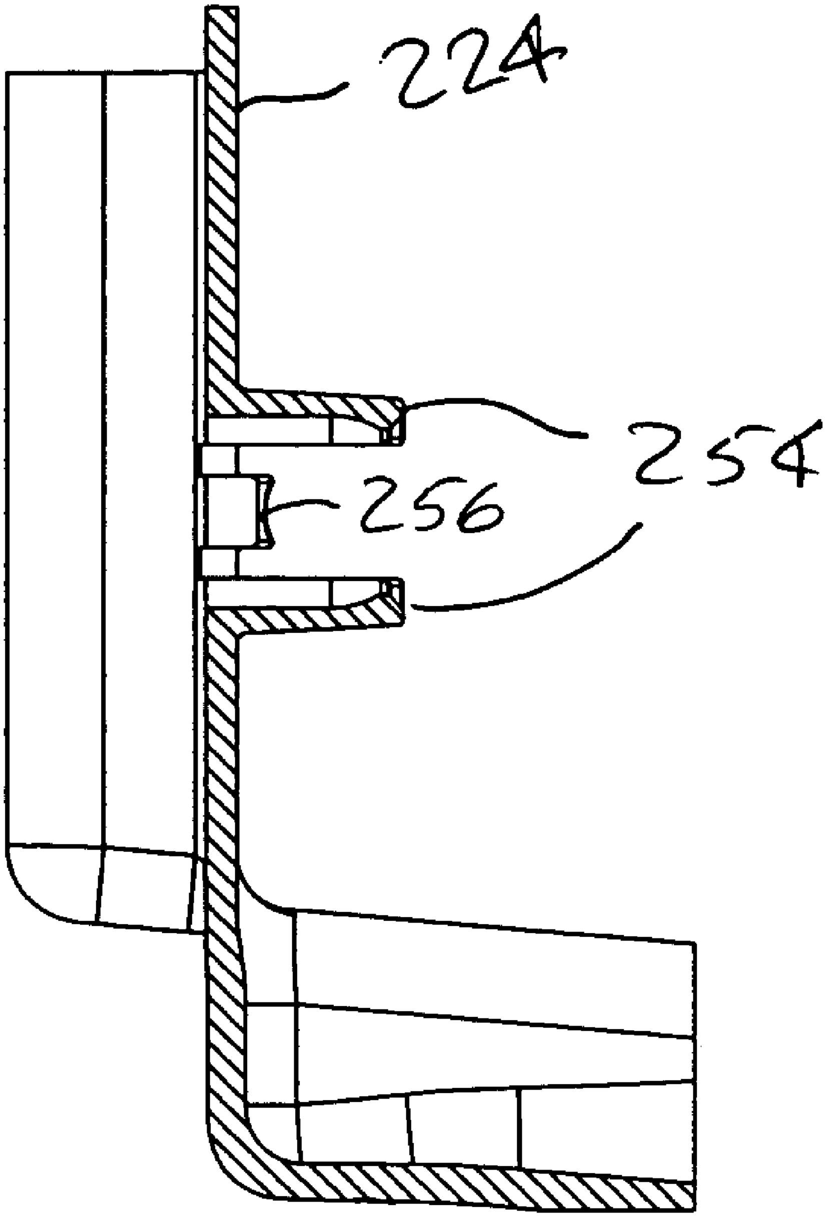
FIG. 40 is a section view of the mounting frame taken along line 40—40 of FIG. 36.
Figure 41:
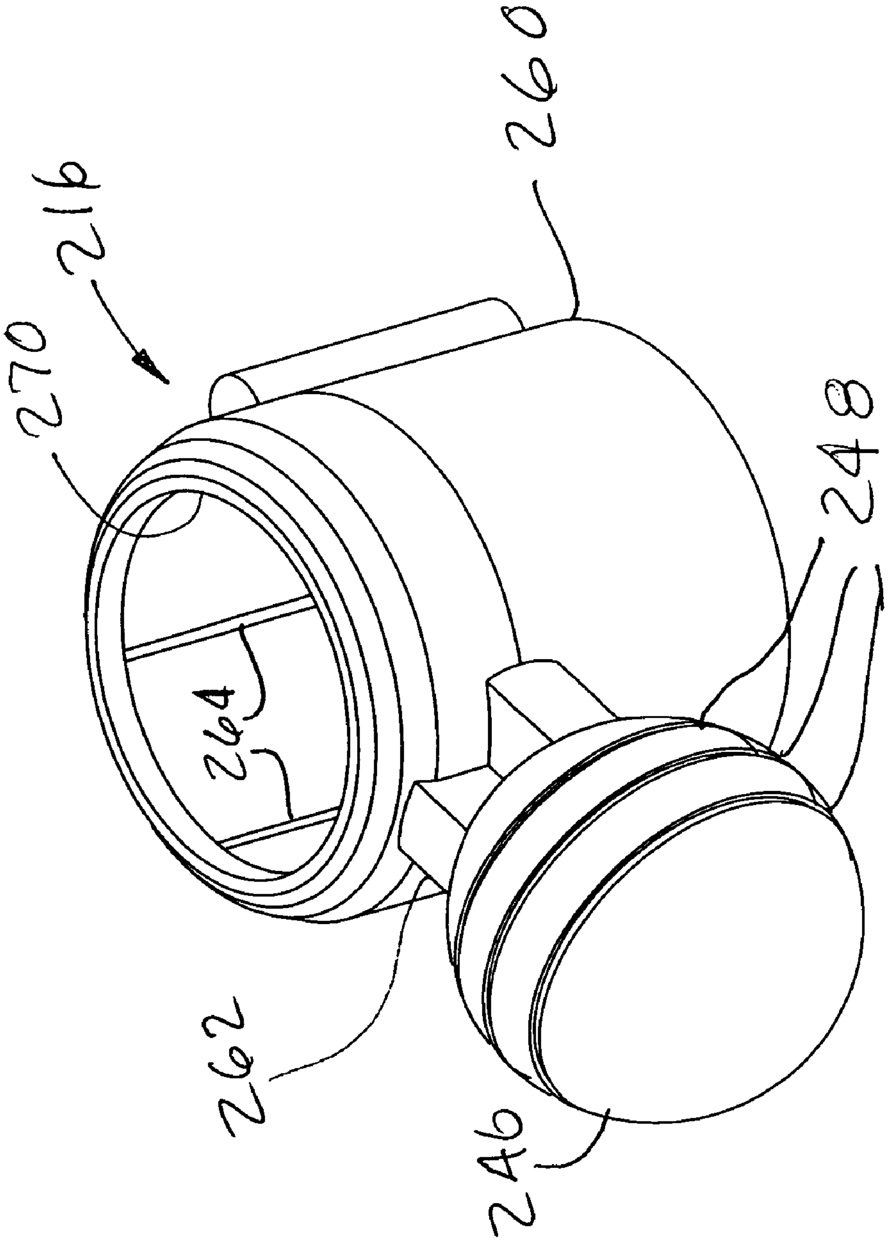
FIG. 41 is a perspective view of a ball-joint mounting head for the laser diode of FIGS. 34 and 35.
Figure 42:
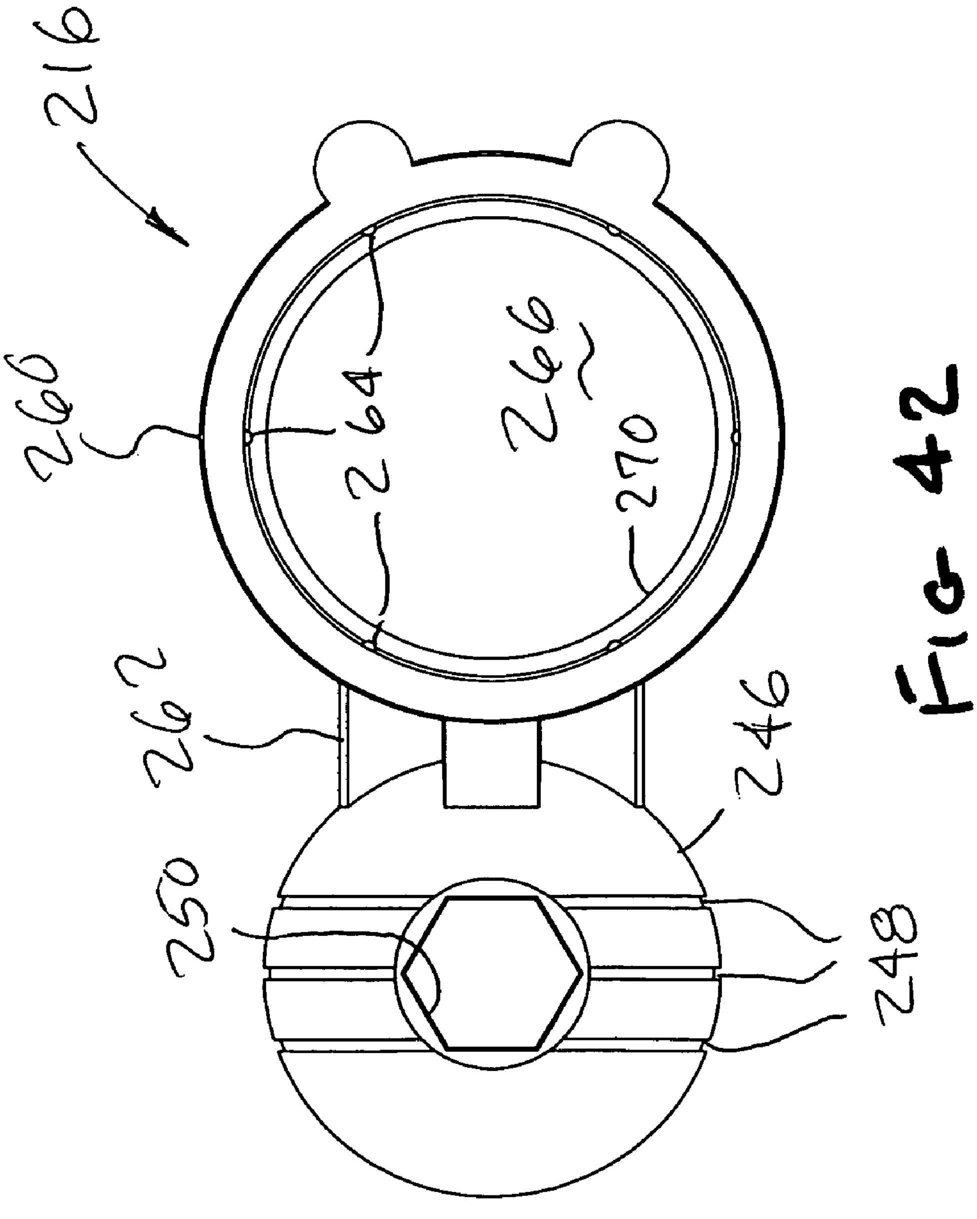
FIG. 42 is a rear end view of the mounting head of FIG. 41.
Figure 43:
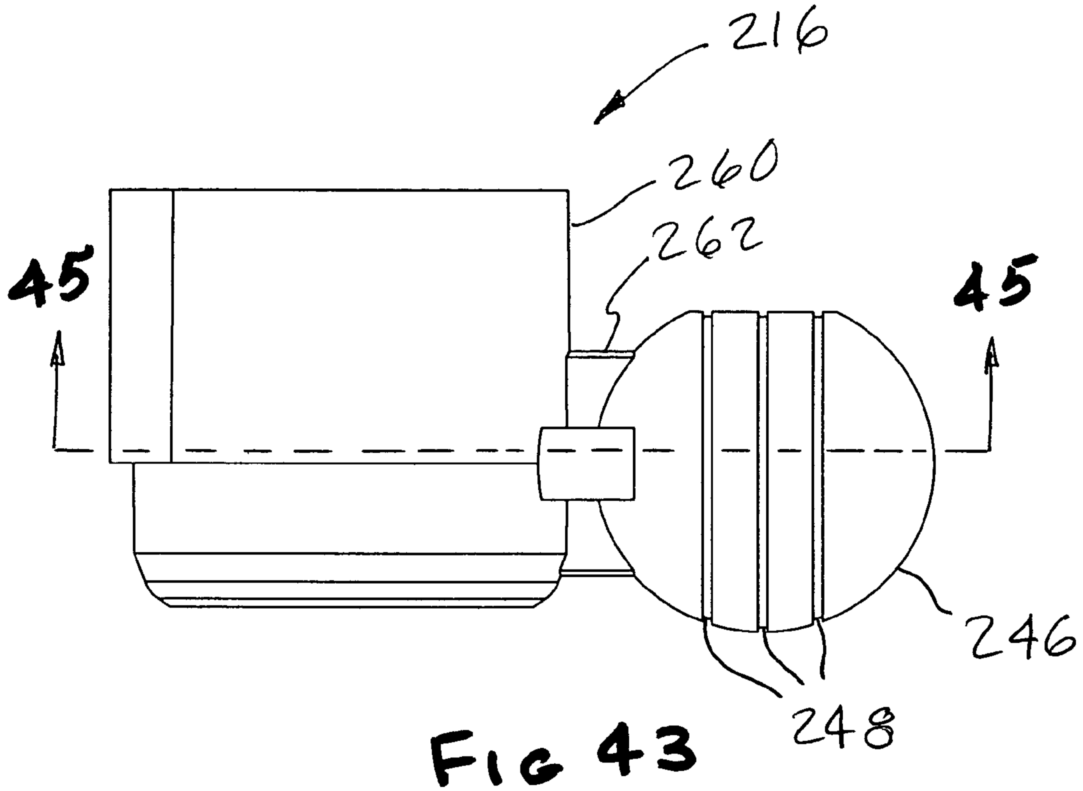
FIG. 43 is a side view of the mounting head of FIG. 41.
Figure 44:
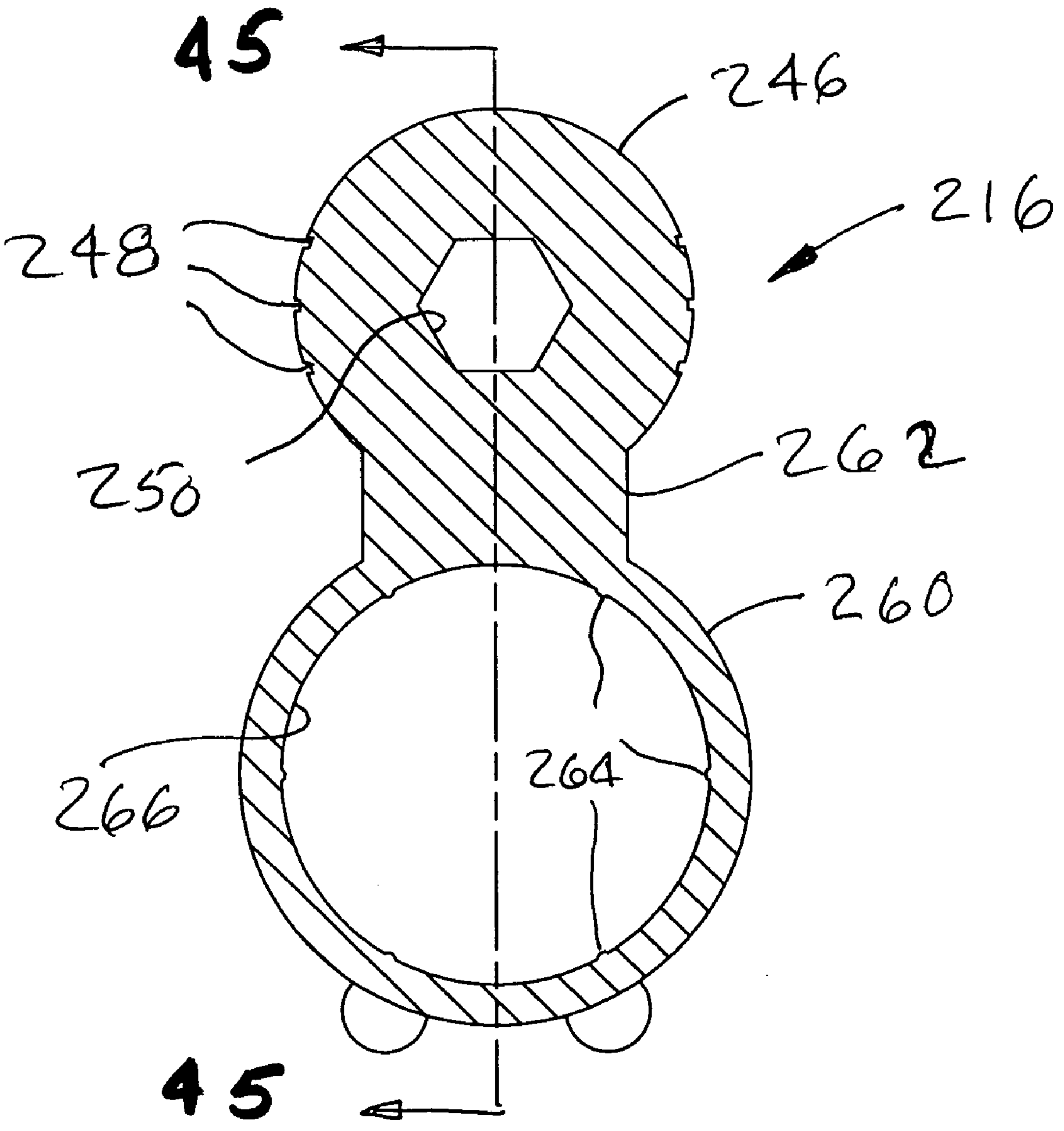
FIG. 44 is a section view taken along line 45—45 of FIG. 43.
Figure 45:
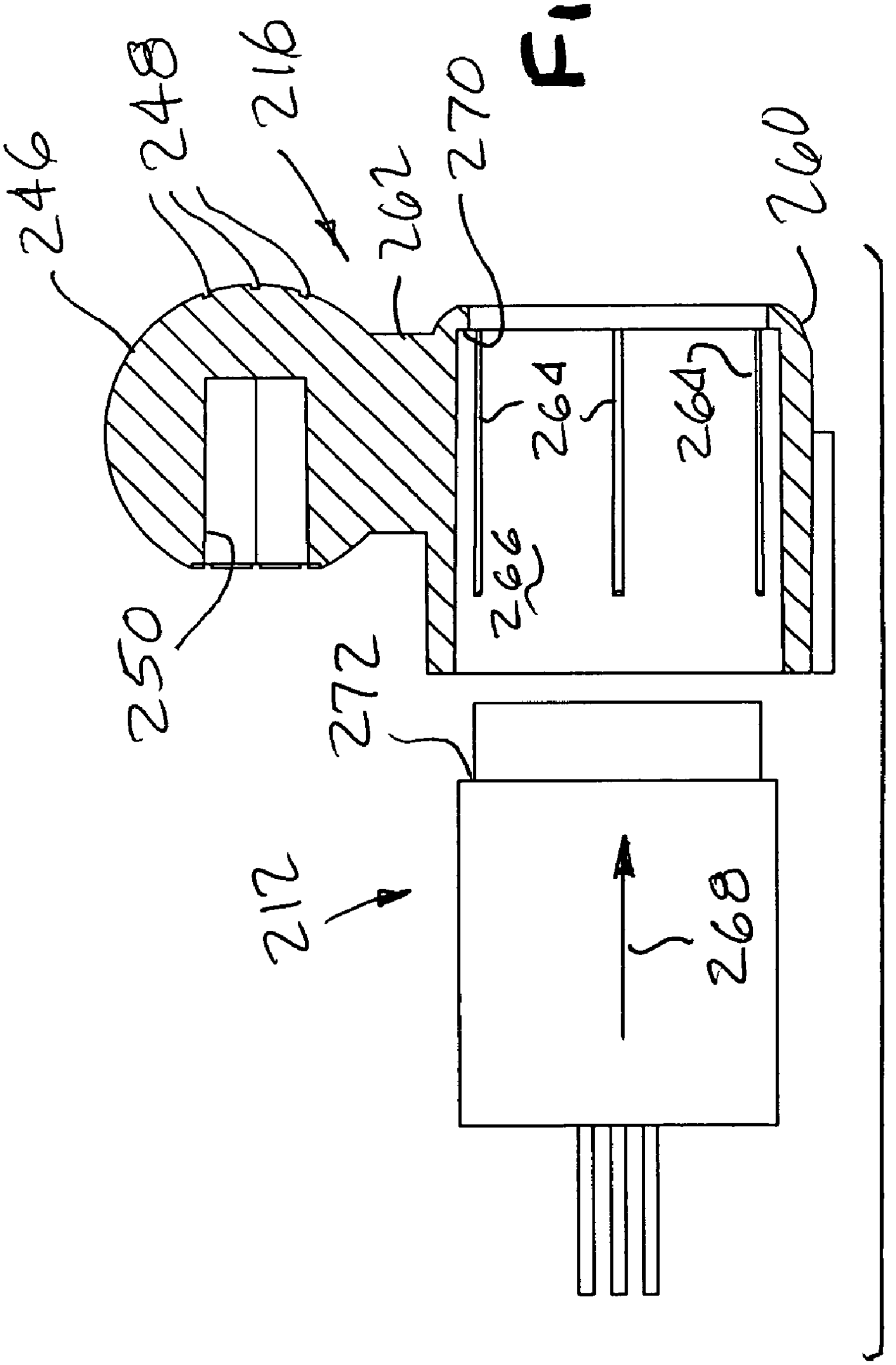
FIG. 45 is an exploded view of the laser diode of FIG. 34 along with a section view of the mounting head taken along line 45—45 of FIG. 44.

FIG. 36 is a front view of the back plate 224 and shows the location of the section views of FIGS. 39 and 40. FIG. 38 is a bottom view of the back plate 224. Each of these views illustrates more clearly certain aspects of the back plate 224.

Referring now to FIGS. 41 through 45, various details of the ball joint mounting head 216 may be seen, it being understood that head 218 is preferably identical to head 216. Head 216 is preferably an integrally formed unitary piece made of a conventional polymer (which may be the same or a similar material to that of back plate 224) with a cylindrical holder 260 connected to ball 246 by a cruciform neck 262. Cylindrical holder 260 preferably has a plurality of crush ribs 264 axially positioned on the interior of a bore 266, and the holder 260 is preferably sized for an interference fit with the laser diode 212, it being understood that the ribs 264 are crushed or deformed when diode 212 is pressed into bore 266 by advancing in the direction of arrow 268 in FIG. 45. Holder 260 may have a lip 270 at one end of the bore 266 to act as a stop for a shoulder 272 on diode 212.

Figure 30:
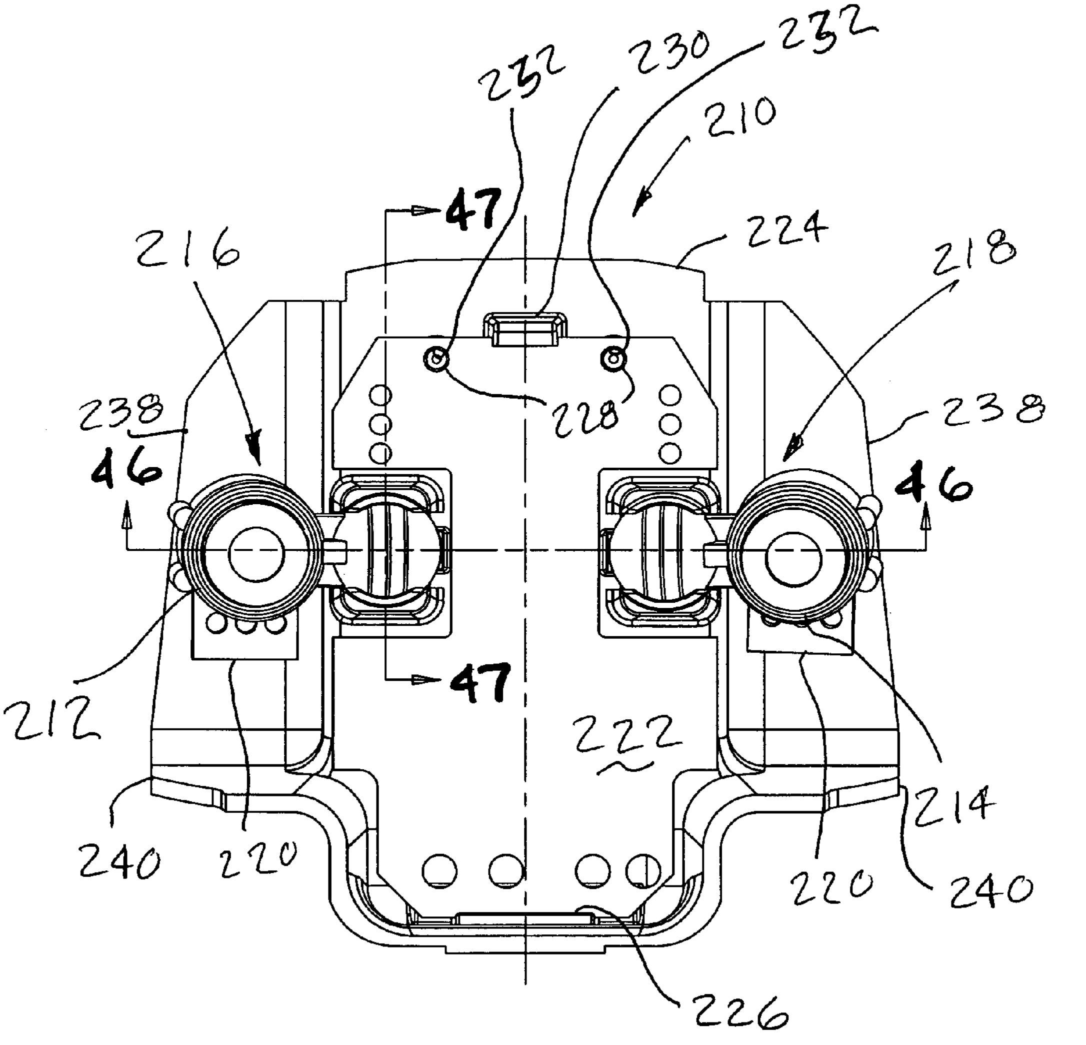
FIG. 30 is a front elevation view of the subassembly of FIG. 28.
Figure 46:
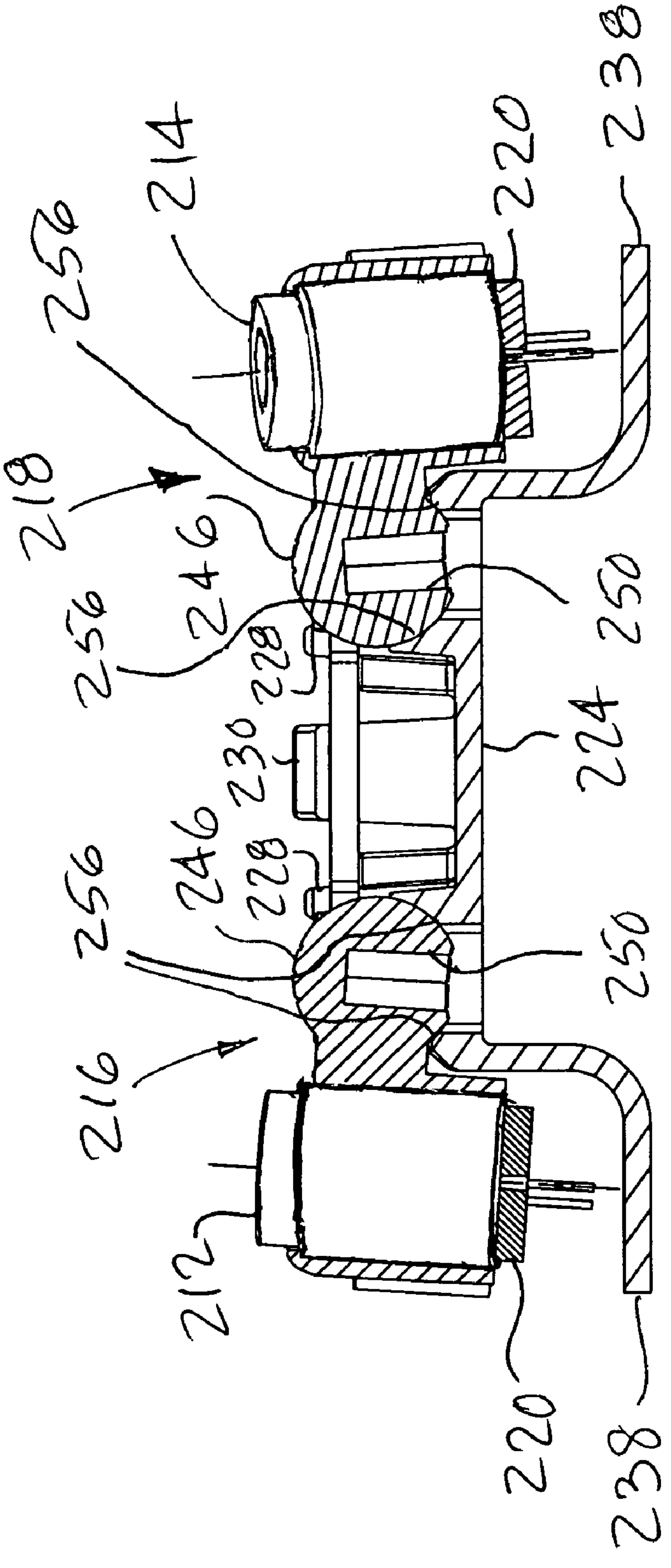
FIG. 46 is a section view taken along line 46—46 of FIG. 30.
Figure 47:
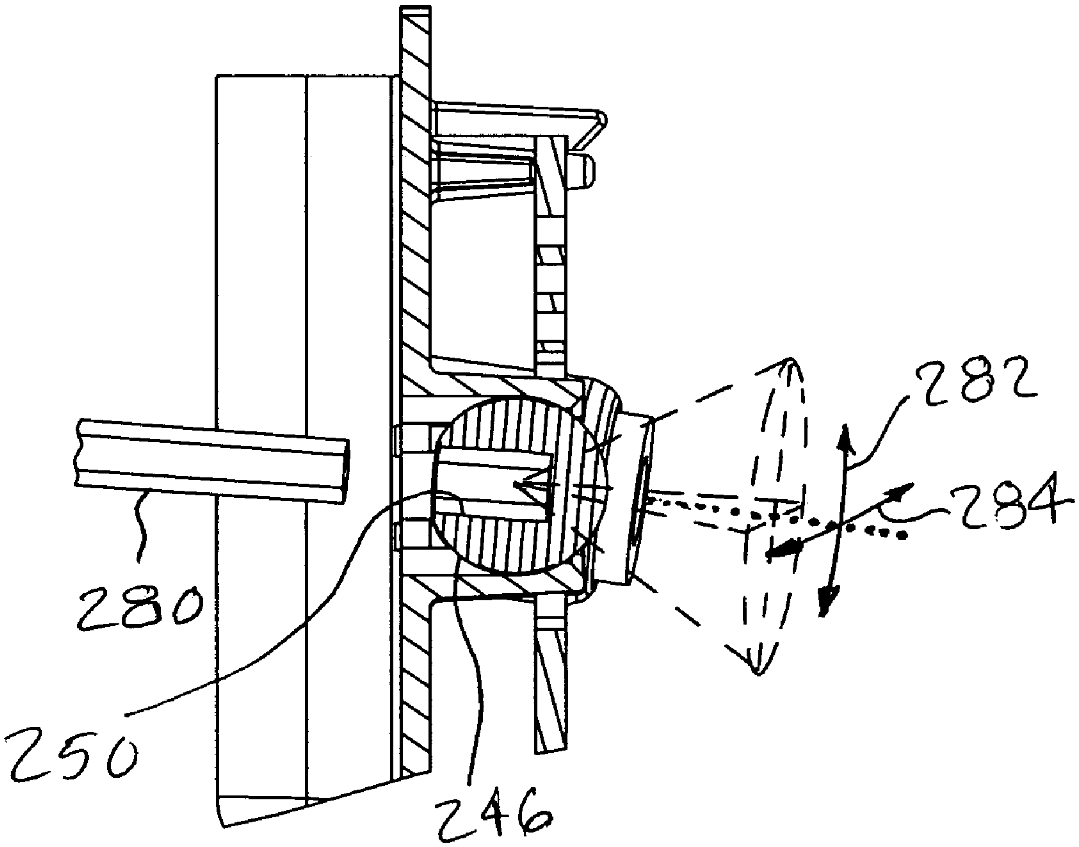
FIG. 47 is a section view taken along line 47—47 of FIG. 30 and showing a fragmentary view of an adjustment tool.

Referring now to FIGS. 46 and 47 which are section views of subassembly 210 taken along lines shown in FIG. 30, an adjustment tool 280, which may be a hexagonal wrench, commonly referred to as an Allen wrench, may be inserted through aperture 252 to engage the hexagonal recess 250 in the ball 246 to adjust the aim of laser 212 during alignment, it being understood that the subassembly 210 is fixtured and energized so that the laser diodes can be aimed at respective targets in the fixture. The tool 280 can be manipulated to adjust the direction of the laser beam in the direction of arrows 282, 284. Once the laser diode is aligned, solvent is applied to the surface of ball 246, welding it to projections 254 and 256, by capillary action of the solvent drawing into the interface between the ball and the projections on the back plate 224 along the grooves 248. The process is repeated for laser diode 214, via adjustment of ball 246 in head 218, and once the alignment is secure, the subassembly 210 can be installed in the gun 56, as mentioned above.

This invention is not to be taken as limited to all of the details thereof as modifications and variations thereof may be made without departing from the spirit or scope of the invention.

What is claimed is:

1. A method of positioning a spray gun at a desired distance away from a target surface, the method comprising:

a. illuminating a pair of spots on a target surface by directing a first beam of visible light and a second beam of visible light emitted from spaced apart locations on a spray gun, wherein the first and second beams are angled to approach one another in a direction taken from the gun towards the target surface and offset such that the spots are always offset from each other;

b. moving the gun toward or away from the surface until the pair of illuminated spots are in a predetermined desired alignment pattern on the target surface whereby the gun is positioned at the desired distance from the surface; and c. causing the spray gun to deliver coating material to the target surface while maintaining the gun substantially at the desired distance by keeping the illuminated spots substantially in the predetermined desired alignment pattern by moving the spray gun generally parallel to the target surface substantially at the desired distance.

2. The method of claim 1 wherein the beams are offset vertically from each other such that the illuminated spots are vertically aligned with and offset from each other when the spray gun is positioned at the desired distance from the target surface.

3. The method of claim 1 wherein step a further comprises focusing the visible light to maximize the intensity of the illuminated spots at the desired distance.

4. The method of claim 1 wherein step a further comprises using a single laser light source to generate the visible light and directing the visible light from the laser light source into a beam splitter located downstream of the laser light source to provide the first and second beams.

5. The method of claim 1 wherein step a further comprises using a first laser light source to provide the first beam and a second laser light source to provide the second beam.

6. The method of claim 1 wherein the first and second light beams present one of two separately recognizable relationship patterns when the gun is at a distance less than the desired distance and wherein the first and second light beams form the other of the separately recognizable relationship pattern when the gun is at a distance greater than the desired distance to the target surface.

7. The method of claim 6 wherein the one separately recognizable relationship pattern has one spot above and to a first side of the other spot, and the other separately recognizable relationship pattern has the one spot above and to a second side of the other spot.

8. A method of positioning a spray gun at a desired distance away from a target surface, the method comprising:

a. illuminating a pair of spots on a target surface by directing a first beam of visible light and a second beam of visible light emitted from spaced apart locations on a spray gun, wherein the first and second beams are angled to approach one another and vertically offset such that the spots are always vertically offset from each other;

b. moving the gun toward or away from the surface until the gun is located at the desired distance from the target surface, wherein when the gun is at the desired distance from the target surface, the pair of illuminated spots are in a predetermined desired alignment pattern relative to one another; and c. causing the spray gun to deliver coating material to the target surface while maintaining the gun substantially at the desired distance by keeping the illuminated spots substantially in the predetermined desired alignment pattern by moving the spray gun generally parallel to the target surface substantially at the desired distance.

9. A method of positioning a spray gun at a desired distance away from a target surface, the method comprising:

a. illuminating a pair of spots on a target surface by directing a first beam of visible light and a second beam of visible light emitted from spaced apart locations on a spray gun, wherein the first and second beams are angled to approach one another and offset such that the beams are always offset from each other;

b. bringing the pair of illuminated spots to a predetermined desired alignment pattern on the target surface by adjusting the distance of the gun from the target surface; and c. causing the spray gun to deliver coating material to the target surface while maintaining the gun substantially at the desired distance by keeping the illuminated spots substantially in the predetermined desired alignment pattern by moving the spray gun generally parallel to the target surface substantially at the desired distance.

* * * * *